US008028223B2

(12) United States Patent
Miyazaki et al.

(10) Patent No.: US 8,028,223 B2
(45) Date of Patent: Sep. 27, 2011

(54) TRANSMISSION DEVICE, ENCODING DEVICE AND DECODING DEVICE

(75) Inventors: Shunji Miyazaki, Kawasaki (JP); Kazuhisa Obuchi, Kawasaki (JP); Tetsuya Yano, Kawasaki (JP); Takashi Dateki, Kawasaki (JP); Mitsuo Kobayashi, Kawasaki (JP); Junya Mikami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 899 days.

(21) Appl. No.: 12/068,707

(22) Filed: Feb. 11, 2008

(65) Prior Publication Data

US 2008/0141103 A1 Jun. 12, 2008

Related U.S. Application Data

(63) Continuation of application No. PCT/JP2005/014824, filed on Aug. 12, 2005.

(51) Int. Cl.
*G06F 11/00* (2006.01)
*H03M 13/00* (2006.01)
(52) U.S. Cl. ........ 714/801; 714/755; 714/786; 714/788; 714/762
(58) Field of Classification Search .................. 714/788, 714/755, 801, 786
See application file for complete search history.

(56) References Cited

U.S. PATENT DOCUMENTS

| 5,724,391 | A | 3/1998 | Takeuchi et al. |
| 7,334,181 | B2 * | 2/2008 | Eroz et al. ..................... 714/801 |
| 2003/0014715 | A1 | 1/2003 | Lobinger et al. |
| 2005/0278606 | A1 | 12/2005 | Richardson et al. |

FOREIGN PATENT DOCUMENTS

| EP | 1 837 999 | 9/2007 |
| JP | 09-146785 | 6/1997 |
| JP | 2003/524984 | 8/2003 |
| JP | 2004/531972 | 10/2004 |
| WO | WO 02-103631 | 12/2002 |
| WO | PCT/JP2005/000367 | 1/2005 |

OTHER PUBLICATIONS

3GPP TS 25.212 V5.9.0; (Jun. 2004); 3rd Generation Partnership Project; Technical Specification Group Radio Access Network; Multiplexing and channel coding (FDD) (Release 5).

* cited by examiner

*Primary Examiner* — Guy Lamarre
(74) *Attorney, Agent, or Firm* — Myers Wolin, LLC

(57) ABSTRACT

Disclosed is a transmission device which transmits a systematic code obtained by adding parity bits to information bits. When the code rate of the systematic code is a value in a specific range determined by the decoding characteristic in a case where dummy bits are not inserted, a dummy bit insertion portion inserts dummy bits into the information bits and shifts the decoding characteristic, so that the code rate assumes a value outside a specific range determined by the decoding characteristic after shifting. An encoding portion performs systematic encoding of the information bits into which the dummy bits are inserted, and deletes the dummy bits from the results of the encoding to generate a systematic code, and a rate matching portion, performs rate matching such that the size of the systematic code is equal to a size determined by the physical channel transmission rate, and transmits the systematic code.

9 Claims, 32 Drawing Sheets

TRANSMISSION DEVICE, ENCODING DEVICE AND DECODING DEVICE

CROSS-REFERENCE TO RELATED APPLICATIONS

This application is a continuation of International Application Number PCT/JP2005/014824, which was filed on Aug. 12, 2005.

BACKGROUND OF THE INVENTION

The present invention relates to a transmission device, encoding device, and decoding device, and in particular relates to a transmission device, encoding device, and decoding device in a communication system in which dummy bits are added to information and encoding is subjected to the information to which the dummy bits are added, then the dummy bits are deleted from the results of the encoding to generate a systematic code and the systematic code is transmitted, and on the receiving side maximum-likelihood values for dummy bits are inserted and decoding is performed.

As shown in FIG. 35, a code is called a systematic code when, upon creating an N-bit code 12 by encoding information bits $I_1$ comprising K bits, K bits among the code comprise the original information; the remaining M (=N−K) bits are called parity bits. Turbocodes are one example of systematic codes.

As the general format of bits, an information alphabet is considered. One alphabet takes as values q types of symbols $\{a_0, a_1, a_2, \ldots, a_{q-1}\}$; bit is a special case of alphabet in which q=2 and $a_0=0$, $a_1=1$.

On the transmitting side, if a K×N generator matrix, $$G=(gij); i=0, \ldots, K-1; j=0, \ldots, N-1$$

is used with K information alphabet elements $u=(u_0, u_1, \ldots, u_{K-1})$ in the following equation, $$x=uG$$

to generate a code alphabet x consisted of N code alphabet elements $x_0, x_1, \ldots, x_{N-1}$ ($x=(x_0, x_1, \ldots, X_{N-1})$), then this code alphabet x is a block code, and the information alphabet elements u are block-encoded.

On the receiving side, the information alphabet elements u are estimated from the data received for the block code (code vector)x. To this end, the following parity check equation for x is used:

$$xH^T=0$$

Here, H=(hij); i=0, ..., M−1; j=0, ..., N−1, is a parity check matrix, and HT is the transpose of H (with the rows and columns interchanged). From the above two equations, H and G satisfy the following relation.

$$GH^T=0$$

From this, if either H or G is given, then the encoding rules are uniquely determined.

FIG. 36 shows the configuration of a communication system in which block encoding is performed in the transmitter and decoding is performed in the receiver; the transmitter 1 comprises an encoding portion 1a, which encodes information u of K bits to generate an N-bit block code x, and a modulation portion 1b which modulates and transmits the block code. The receiver 2 comprises a demodulation portion 2a, which demodulates the signal received via a transmission path 3, and a decoding portion 2b, which decodes the N bits of received information to obtain the original K bits of transmitted information.

The encoding portion 1a comprises a parity generator 1c, which generates M (=N−K) parity bits p, and a P/S conversion portion 1d, which combines the K bits of information u and M parity bits p and outputs N (=K+M) block code elements x. As the code of the encoding portion 1a, for example, a turbocode can be adopted. The decoding portion 2b comprises a decoder 2c, which performs error detection and correction processing of the received likelihood data y and performs decoding to restore the original transmitted K bits of information and outputs estimation information. The block code x transmitted from the transmitter 1 is affected by the transmission path 3, and so is not input to the decoder 2c in the form transmitted, but is input to the decoder 2c as likelihood data. The likelihood data comprises reliabilities as to whether a code bit is 0 or 1, and signs (indicating "0" if +1 and "1" if −1). The decoder 2c performs stipulated decoding processing based on the likelihood data for each signed bit, to estimate the information bits u. In the case of a turbocode, the decoder 2c performs maximum a posteriori probability (MAP) decoding.

FIG. 37 shows the configuration of a turbo encoding portion 1a; FIG. 38 shows the configuration of a turbo decoding portion 2b. A turbo encoding portion is a systematic encoder comprising a number of element encoders and an interleaver; by adopting MAP decoding, decoding result errors can be reduced by increasing the number of decoding repetitions.

FIG. 37 is one such example; in this encoder, two element encoders are arranged in parallel with one interleaver therebetween. Here $u=[u0, u1, u2, u3, \ldots, u_{K-1}]$ is the information data for transmission, of length K; xa, xb, xc are encoded data resulting from encoding of the information data u by the turbo encoder 1a; ya, yb, yc are received signals, resulting from propagation of the encoded data xa, xb, xc over the communication path 3, and are affected by noise and fading; and u' is the result of decoding of the received data ya, yb, yc by the turbo decoder 2b. In the turbo encoder 1a, the encoded data xa is the information data u itself; the encoded data xb is data resulting from convolution encoding of the information data u by a first element encoder ENC1; and the encoded data xc is data resulting from interleaving (π) of the information data u and convolution encoding by a second element encoder ENC2. That is, the turbo encoder performs systematic encoding using two convolutions; xa is the information data, and xb and xc are parity data. The P/S conversion portion 1d converts the encoded data xa, xb, xc into a series and outputs the result.

In the turbo decoder 2b of FIG. 38, the first element decoder DEC1 performs decoding using ya and yb among the received signals ya, yb, yc. The first element decoder DEC1 is a soft decision-output element decoder, which outputs likelihoods of decoding results. Next, the second element decoder DEC2 similarly performs decoding using yc and the likelihoods output from the first element decoder DEC1. The second element decoder DEC2 is also a soft decision-output element decoder, which outputs likelihoods of decoding results. In this case, yc is the received signal corresponding to xc, which results from interleaving and encoding the original data u; hence likelihoods output from the first element decoder DEC1 are interleaved (π) before input to the second element decoder DEC2. Likelihoods output from the second element decoder DEC2 are deinterleaved ($\pi^{-1}$), and are then input to the first element decoder DEC1 as feedback. The "0" and "1" hard decision results of the deinterleaving results of the second element decoder DEC2 are taken to be the turbo decoding results (decoded data) u'. Thereafter, by repeating the above decoding operation a prescribed number of times, the error rate of the decoding result u' can be reduced. MAP element decoders can be used as the first and second element decoders DEC1, DEC2 in the turbo decoder.

A 3GPP W-CDMA mobile communication system may be considered as a concrete form of the communication system of FIG. 36. FIG. 39 shows the configuration of a 3GPP W-CDMA mobile communication system; the wireless base stations are transmitters of FIG. 36, and the mobile station is a receiver. In FIG. 39, the mobile communication system comprises a core network 11, wireless base station control devices (RNC, radio network controllers) 12, 13, demultiplexing devices 14, 15, wireless base stations (Node B) $16_1$ to $16_5$, and a mobile station (UE, user equipment) 17.

The core network 11 is a network which performs routing within the mobile communication system, and can for example be configured as an ATM switching network, packet-switched network, router network, or similar. The core network 11 is also connected to other public networks (PSTN), and the mobile station 7 can also communicate with fixed telephone sets and similar.

The wireless base station control devices (RNCs) 12, 13 are positioned as higher-level devices relative to the wireless base stations $16_1$ to $16_5$, and are provided with functions for controlling these wireless base stations $16_1$ to $16_5$ (ex. Function for managing wireless resources used, and similar). The demultiplexing devices 14, 15 are provided between the RNCs and the wireless base stations, and separate signals addressed to each of the wireless base stations received from the RNCs 12, 13, for output to the respective wireless base stations, as well as executing control to multiplex signals from the wireless base stations and pass the signals to the RNCs.

Wireless resources of the wireless base stations $16_1$ to $16_3$ are managed by the RNC 12, and wireless resources of the wireless base stations $16_4$ and $16_5$ are managed by the RNC 13, while the base stations perform wireless communication with the mobile station 17. When the mobile station 17 exists within the wireless area of the wireless base stations $16_i$, a wireless connection with the wireless base stations $16_i$ is established, and communication with other communication devices is performed via the core network 11.

The above is an explanation of a general mobile communication system; in order to enable high-speed downlink-direction data transmission (packet transmission), a HSDPA (High Speed Downlink Packet Access) method is adopted.

HSDPA employs an adaptive encoding modulation method, and is characterized by the fact that the number of bits in the transport block TrBL, number of multiplex codes, and modulation method (QPSK modulation, 16QAM modulation) are switched adaptively according to the wireless environment between the wireless base station and the mobile station.

Further, HSDPA adopts an H-ARQ (Hybrid Automatic Repeat reQuest) method. In H-ARQ, when an error is detected by the mobile station in data received from a wireless base station, resending is requested (a NACK signal is sent) to the wireless base station. Upon receiving this resend request, the wireless base station resends the data, and so the mobile station uses both the data already received and the resent received data to perform error correction decoding. In this way, in H-ARQ previously received data is effectively utilized even when there are errors, so that the gain of error-correction decoding is increased, and consequently the number of resends can be kept small. When an ACK signal is received from a mobile station, there is no longer a need for resending since data transmission has been successful, and so the next data is transmitted.

The main wireless channels used in HSDPA are, as shown in FIG. 40, (1) HS-SCCH (High Speed-Shared Control Channel), (2) HS-PDSCH (High Speed-Physical Downlink Shared Channel), and (3) HS-DPCCH (High Speed-Dedicated Physical Control Channel).

HS-SCCH and HS-PDSCH are shared channels in the downlink direction, that is, from wireless base stations to mobile stations; HS-PDSCH is a shared channel which transmits packets in the downlink direction, while HS-SCCH is a control channel which transmits various parameters relating to data transmitted in HS-PDSCH. In other words, HS-SCCH is a channel used for notification of the transmission of data via HS-PDSCH; the various parameters are the destination mobile station information, transmission bitrate information, modulation method information, number of spreading codes allocated (number of codes), rate matching patterns for the transmission data, and other information.

HS-DPCCH is a dedicated control channel in the uplink direction, that is, from mobile stations to wireless base stations, and is used when transmitting, from mobile stations to wireless base stations, the reception results (ACK signals, NACK signals) for data received via HS-PDSCH. HS-DPCCH is also used to transmit CQI (Channel Quality Indicator) values, based on the reception quality of signals received from wireless base stations, to wireless base stations. By receiving CQI values, the wireless base stations can judge the quality of downlink wireless environments, and if an environment is satisfactory, can switch to a modulation method enabling faster data transmission, but if the environment is poor, can switch to a modulation method for slower data transmission, and by this means can perform adaptive modulation. In actuality, a base station has a CQI table which defines formats with different transmission speeds according to CQI values of 1 to 30; parameters (transmission rate, modulation method, number of multiplexing codes, and similar) are determined according to the CQI value by making a reference to the CQI table, and are notified mobile stations by HS-SCCH, while in addition data is transmitted to mobile stations using HS-PDSCH based on the parameters.

In the above-described 3GPP W-CDMA mobile communication system, the transmitter 1 and the receiver 2 in FIG. 36 are a wireless base station and a mobile station (mobile terminal) respectively.

FIG. 41 shows the data transmission processing block of a 3GPP W-CDMA wireless base station, and FIG. 42 shows the data format used in explanation of transmission processing (see 3GPP, TS25.212v5.9.0). An example is shown for which the number of code blocks is 2, both 1stRM 25b and 2 nsRM 25c in the physical layer H-ARQ function portion 25 are puncturing, and the number of physical channel codes is 2.

(1) Information bits are passed from the upper layer to the wireless base station as a transport block (TB).

(2) The CRC addition portion 21 performs encoding for detection of errors by CRC (Cyclic Redundancy Check) in transport block (TB) units. That is, based on a transport block TB, a specified number of CRC parity bits are generated, and these are added after the transport block TB itself. (data set D1)

(3) Then, the bit scrambling portion 22 performs bit scrambling of the data set D1. In bit scrambling, bitwise addition of a pseudorandom bit pattern B=(b0, . . . , b(K−1)), generated by a stipulated generation method and of the same size K as the data set D1, and the data set D1 is performed (hereafter, arithmetic operations on bits are always taken to mean mod2 operations on {0,1}). (data set D2)

(4) The code block segmentation portion 23 performs code block segmentation of the data set D2. That is, if the size K of the data set D2 exceeds a stipulated size Z, the data set D2 is segmented to obtain a plurality of code blocks all of the same data size. If the data cannot be divided evenly by the number of code blocks C, filler bits are added to adjust the size. Filler bits are of value 0, and are added to the beginning of the original data. In turbo encoding, $40 \leqq K \leqq 5114$, so that Z=5114. (data set D3)

(5) The channel coding portion (encoding portion) 24 performs encoding of each of the code blocks of the data set D3. Encoding uses a turbocode at the stipulated code rate R=⅓. (data set D4)

(6) The physical layer HARQ function portion 25 performs H-ARQ processing (H-ARQ functionality) for the data set D5. The bit segmentation portion 25a of the physical layer HARQ function portion 25 divides each of the code blocks output from the encoding portion 24 into systematic bits, parity bits 1, and parity bits 2, and serially concatenates bits of the same type. (data set D5)

(7) The first rate matching portion 25b of the physical HARQ function portion 25 checks whether the total bit length of data set D5 is larger than the stipulated buffer size NIR, and if larger, performs puncturing of the data set D5 such that the size becomes the NIR size, but if smaller than NIR, does nothing. Puncturing is performed for parity 1 and parity 2, but is not performed for systematic bits. (data set D61)

Next, the second rate matching portion 25c of the physical layer HARQ function portion 25 performs rate matching (repetition or puncturing) of the data set D61 according to specified H-ARQ transmission parameters. H-ARQ transmission parameters may include: modulation method (QPSK or 16QAM), physical channel HS-PDSCH total bit size Ndata, H-ARQ transmission pattern RV and so on.

The total bit size Ndata is given by

Ndata=number of codes×physical channel size and the physical channel size is 960 for QPSK and 1920 for 16QAM. When the size of the data set D61 is smaller than Ndata, the second rate matching portion 25c performs repetition such that the size of the data set D61 is equal to Ndata; when larger than Ndata, puncturing is performed. (data set D62)

In repetition, a specified number of bits are selected from among the code bits, a copy is created and is added; on the receiving side, diversity combining of the same data bits is performed so as to improve the SN. In puncturing, a specified number of bits are selected from among the code bits, and these bits are deleted; on the receiving side, fixed likelihood maximum values are added as data for the deleted bit positions.

Of the above parameters, the receiver (terminal) is notified of the modulation method, number of codes, RV and similar via the separate shared channel HS-SCCH.

(8) The bit collection portion 25d of the physical layer HARQ function portion 25 performs bit collection of the data set D62, and outputs collection results. Then, the bit collection portion 25d performs substitution of the data order so as to map systematic bits and parity bits to one modulation signal symbol.

This substitution processing is one type of interleaving. That is, with the number of bits mapped to one modulation signal symbol as the number of columns Ncol, and the number of rows Nrow=Ndata/Ncol, the Ndata data bits are arranged in a matrix. In the case of QPSK, Ncol=2; for 16QAM, Ncol=4. In the above substitution processing, the systematic bit placement area and parity bit placement area are divided such that systematic bits are in the upper rows. For example, in the case of 16QAM, in this substitution processing systematic bits are preferentially mapped to the first two bits of the four bits. This is because 16QAM mapping stipulates that reliability of the likelihood for the leading two bits be high. The bits in each column of the matrix form one modulation signal symbol. (data set D7)

(9) The physical channel segmentation portion 26 performs physical channel segmentation of the data set D7. The number of divisions is the above number of codes. The data set D7 is serially segmented from the leading bit into this number of divisions. (data set D8)

(10) The HS-PDSCH interleaving portion 27 performs H-ARQ interleaving of the data set D8. That is, the interleaving portion 27 performs interleaving of the physical channels using a stipulated interleave pattern. (data set D9)

(11) The constellation rearrangement portion 28 performs constellation rearrangement of the data set D9 when the modulation method is 16QAM. However, when the modulation method is QPSK, no action is taken. In symbol rearrangement, bit substitution and inversion are performed for each symbol in four-bit units according to the specified parameters. (data set D10)

(12) The physical channel mapping portion 29 performs physical channel mapping of the data set D10, and passes the physical channel data of data set D10, unmodified, to the modulation portion.

As the encoding/decoding method for the systematic code, in order to improve the error rate characteristic of the decoded results, technology has been proposed in which, on the transmitting side, dummy bits are inserted into information bits and encoding is performed, then the dummy bits are deleted from the code thus obtained to generate a systematic code, and the systematic code is transmitted (see PCT/JP 2005/367 and Tokuhyo No. 2004-531972 (JP2004-531972), paragraph 0104). FIG. 43 explains the encoding/decoding method proposed in PCT/JP 2005/367.

Into the K information bits 100 are inserted K0 dummy bits 200 in a prescribed pattern, to obtain K1 (=K+K0) bits of first information. The dummy bits are not limited to an all-"1"s pattern or to a repeated alternation of "1"s and "0"s, as in "1010 . . . 10", and any prescribed pattern can be used. The dummy bits 200 can be added before or behind the information bits 100, or can be inserted uniformly among the information bits. In the figure, the dummy bits 200 are inserted after the information bits 100.

Then, the information bits of the K1 bits are used to create M parity bits 300, which are added to the K1 bits to generate N1 (=K1+M) bits of information 400 (systematic encoding such as turbo encoding). Thereafter, the K0 dummy bits 200 are deleted from this information to generate N (=K+M) bits of a systematic code 500; this systematic code 500 is transmitted from the transmitter to the receiver, and decoding is performed at the receiver. The code rate is R=K/(K+M).

The decoding portion of the receiver inserts the dummy bits 200 deleted on the transmitting side into the demodulated systematic code 500 as maximum probabilities (reliability ∞), and then performs turbo decoding and outputs information bits 100.

FIG. 44 shows the configuration of a communication system which realizes the encoding/decoding method of FIG. 43; portions which are the same as in FIG. 36 are assigned the same symbols. The encoding portion 1a of the transmitter 1 applies forward error correction (FEC) to the information bits u, in order to perform transmission with high reliability, the modulation portion 1b modulates the resulting code bits x, and the modulated signals are transmitted to the receiver 2 via the wireless propagation path 3. The demodulation portion 2a of the receiver 2 demodulates the received data, and inputs to the decoding portion 2b likelihood data y comprising reliabilities as to whether code bits are "0" or "1" and symbols ($+1 \to 0, -1 \to 1$). The decoding portion 2b performs stipulated decoding processing based on the likelihood data for each code bit, and estimates the information bits u.

In the encoding portion 1a of the transmitter 1, the dummy bit insertion portion 1e inserts K0 randomly selected bits 0, 1 as dummy bits at randomly selected positions in the K information bits u, and outputs K1=K+K0 information bits $$(u,a)=(u_0, \ldots, u_{K-1}, a_0, \ldots, a_{K0-1})$$

The encoder if performs turbo encoding using the K1 information bits with the dummy bits inserted, and outputs N1 (=K+K0+M) information bits $x_1(u,a,p)$. Here p are M parity bits, $$p=(p_0, \ldots, p_{M-1})$$

The dummy bit deletion portion 1g deletes the K0 dummy bits a from the N1 information bits $x_1(u,a,p)$ output from the encoder if, to generate the N information bits $$x=(u,p)=(x_0, x_1, \ldots, x_{N-1})$$

The modulation portion 1b modulates the information bits x and transmits the result.

The demodulation portion 2a of the receiver 20 receives the data, which has passed through the propagation path 3 and had noise added, performs demodulation, and inputs to the decoding portion 2b the likelihood data for each code bit $$y=(y_0, y_1, \ldots, y_{N-1})$$

The dummy bit likelihood insertion portion 2d of the decoding portion 2b inserts likelihood data a with maximum likelihood (reliability m) at the positions at which dummy bits were inserted at the transmitter, and inputs the result, as N1 (=N+K0) likelihood data items, to the decoder 2e. The decoder 2e performs turbo decoding of the N1 likelihood data items (y, a), and outputs information bit estimation results.

In this way, by appropriately inserting and deleting dummy bits on the transmitting and on the receiving sides, decoding errors can be decreased.

When the above method is applied to a wireless base station comprising the transmission processing portion shown in FIG. 41, exactly how dummy bits are inserted and deleted poses a problem.

In particular, the encoding device must be configured taking into consideration the dummy bit insertion/deletion positions, whether to make the code rate fixed or variable, whether to segment code blocks, the size after dummy bit insertion, and other matters.

Further, dummy bits must be inserted into information bits so as to effectively reduce decoding errors.

Further, upon encoding, when for example a turbocode is used for encoding with interleaving and deinterleaving, dummy bits must be inserted into information bits such that decoding errors are effectively reduced with interleaving and deinterleaving taken into account.

SUMMARY OF THE INVENTION

In light of the above, an object of this invention is to insert dummy bits into information bits so as to enable effective reduction of decoding errors.

A further object of this invention is, in the case of a code, such as a turbocode, which performs interleaving and deinterleaving upon encoding, to insert dummy bits into information bit positions such that decoding errors can be effectively reduced, taking interleaving and deinterleaving into account.

A further object of this invention is to enable accurate decoding even when dummy bits are inserted into information bits and encoding is performed.

According to this invention, the above objects are attained by means of a first transmission device in a system which transmits and receives systematic code obtained by adding parity bits to information bits. The first transmission device comprises a code rate monitoring portion, which monitors whether the code rate of the systematic code for transmission is a value within a specific range determined by decoding characteristic in a case where dummy bits are not inserted; a dummy bit insertion portion, which, when the code rate is a value within the specific range, inserts dummy bits into information bits and shifts the decoding characteristic, so that the code rate is a value outside a specific range determined by the decoding characteristic after shifting; a systematic code generation portion, which performs systematic encoding of information bits into which the dummy bits are inserted, and also deletes the dummy bits from the results of the systematic encoding to generate a systematic code; and, a rate matching portion, which performs rate matching processing such that the size of the systematic code from which the dummy bits are deleted is equal to a size determined by the transmission rate of the physical channel.

By means of the first transmission device, dummy bits are added such that the code rate does not become a specific value which causes degradation of the decoding characteristic, so that decoding characteristic degradation can be prevented.

According to this invention, the above objects are attained by means of a second transmission device, in a communication system in which information bits into which dummy bits are inserted are subjected to systematically encoding, the dummy bits are deleted from the results of the encoding to obtain a systematic code which is transmitted, and on the receiving side the dummy bits deleted on the transmitting side are inserted into the received systematic code and decoding is performed. The second transmission device comprises a dummy bit insertion portion, which inserts dummy bits into information bits; a systematic code generation portion, which performs turbo encoding of information bits into which the dummy bits are inserted, and also deletes the dummy bits from the results of the turbo encoding to generate a systematic code and a transmission portion, which transmits the systematic code wherein the dummy bit insertion portion inserts dummy bits into the information bits such that, in the information bits both before and after interleaving in the turbo encoding processing, the dummy bit insertion position patterns are substantially uniform.

By means of the second transmission device, in a case where turbocode is adopted, the dummy bit insertion position patterns in both the first and second inputs, which are the inputs to the first element encoder and to the second element encoder, are made as uniform as possible, so that decoding characteristics can be improved.

According to this invention, the above objects are attained by means of a third transmission device, in a communication system in which systematic code obtained by adding parity bits to information bits is transmitted, and on the receiving side the systematic code is decoded. The third transmission device comprises a dummy bit size decision portion, which decides the size of the dummy bits to be inserted into the information bits in encoding processing, a turbo encoding portion, which generates parity bits using the information bits into which the dummy bits are inserted, and moreover adds the parity bits to the information bits into which dummy bits are not inserted to generate a systematic code and outputs the systematic code and a transmission portion, which transmits the systematic code wherein the turbo encoding portion comprises a dummy bit insertion portion, which inserts first dummy bits of a prescribed size into the information bits, and inserts second dummy bits of a prescribed size into the information bits resulting from interleaving; an element encoding portion, which performs first and second element encoding of the information bits into which the first and second dummy bits are inserted, to generate first and second parity bits; and a combination portion, which takes information bits into which the dummy bits are not inserted to be systematic bits, and combines the systematic bits with the first and second parity bits and outputs the result.

A decoding device on the receiving side corresponding to the third transmission device comprises an element decoding portion, which performs first and second element decoding corresponding to the first and second element encoding; a dummy bit data deletion portion, which deletes the first and second dummy bits from the results of the first and second element decoding respectively; an interleaving portion, which performs interleaving of the first decoding result, obtained from the first element decoding result by deleting the first dummy bits; a deinterleaving portion, which performs deinterleaving of the second decoding result, obtained from the second element decoding result by deleting the second dummy bits; and, a dummy bit insertion portion, which inserts the first and second dummy bits, as maximum-likelihood values, into the first and second decoding results to which interleaving and deinterleaving are subjected respectively, and inputs the results to the element decoding portion.

By means of the third transmission device, in a case where turbocode is adopted, dummy bit insertion positions in the first and second inputs of the first element encoder and second element encoder can be decided mutually independently, so that dummy bit insertion positions can easily be made uniform, and decoding characteristics can be improved.

Further, by means of the third transmission device, since the dummy bits are deleted in the turbo encoder, a dummy bit deletion portion to delete dummy bits from systematic bits can be rendered unnecessary.

DESCRIPTION OF THE PREFERRED EMBODIMENTS (A) First Embodiment

Figure 1:
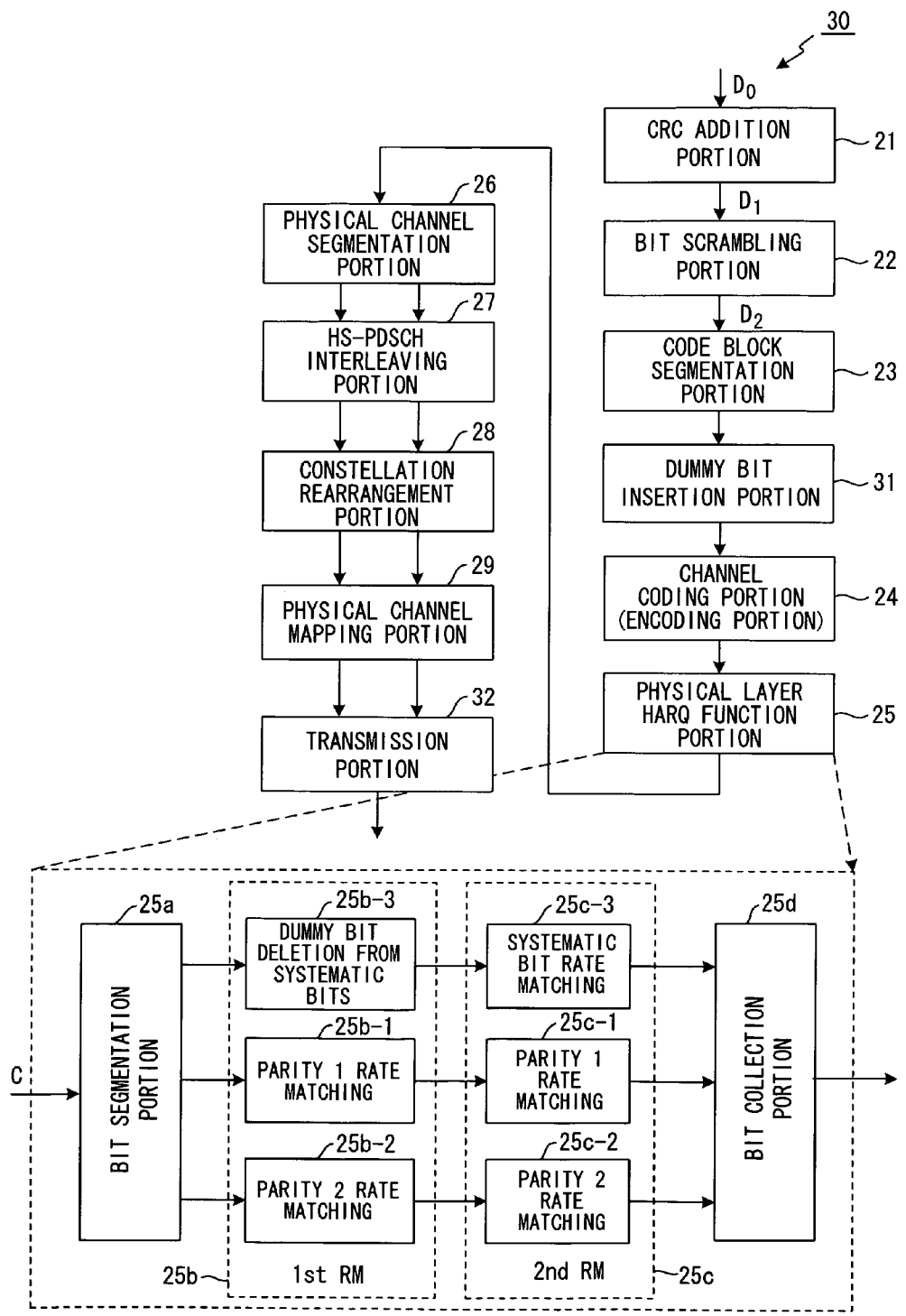
FIG. 1 shows the configuration of the transmission processing portion of the wireless base station of a first embodiment.
Figure 41:
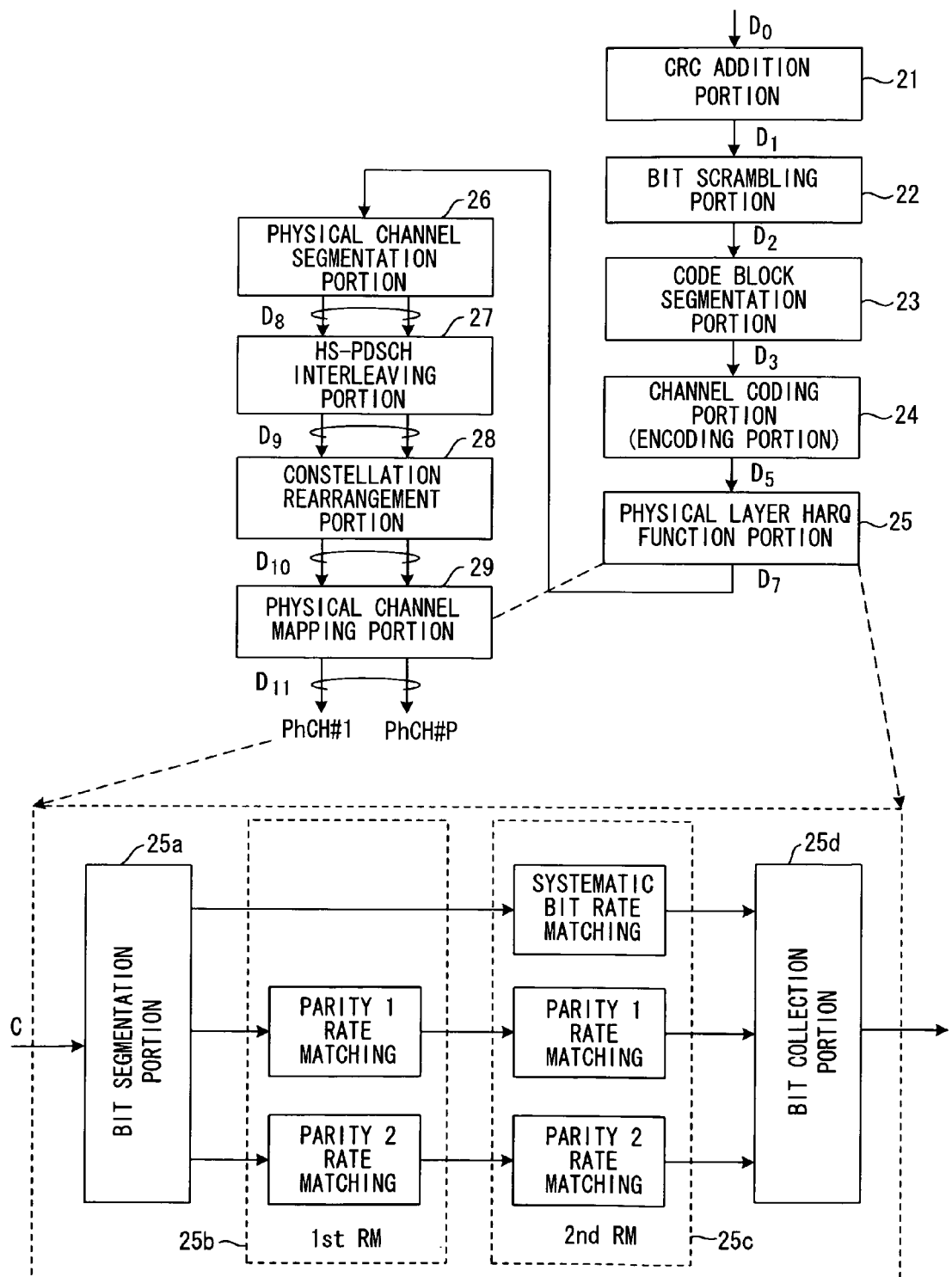
FIG. 41 is a block diagram of the transmission processing portion in a 3GPP W-CDMA wireless base station.
Figure 42:
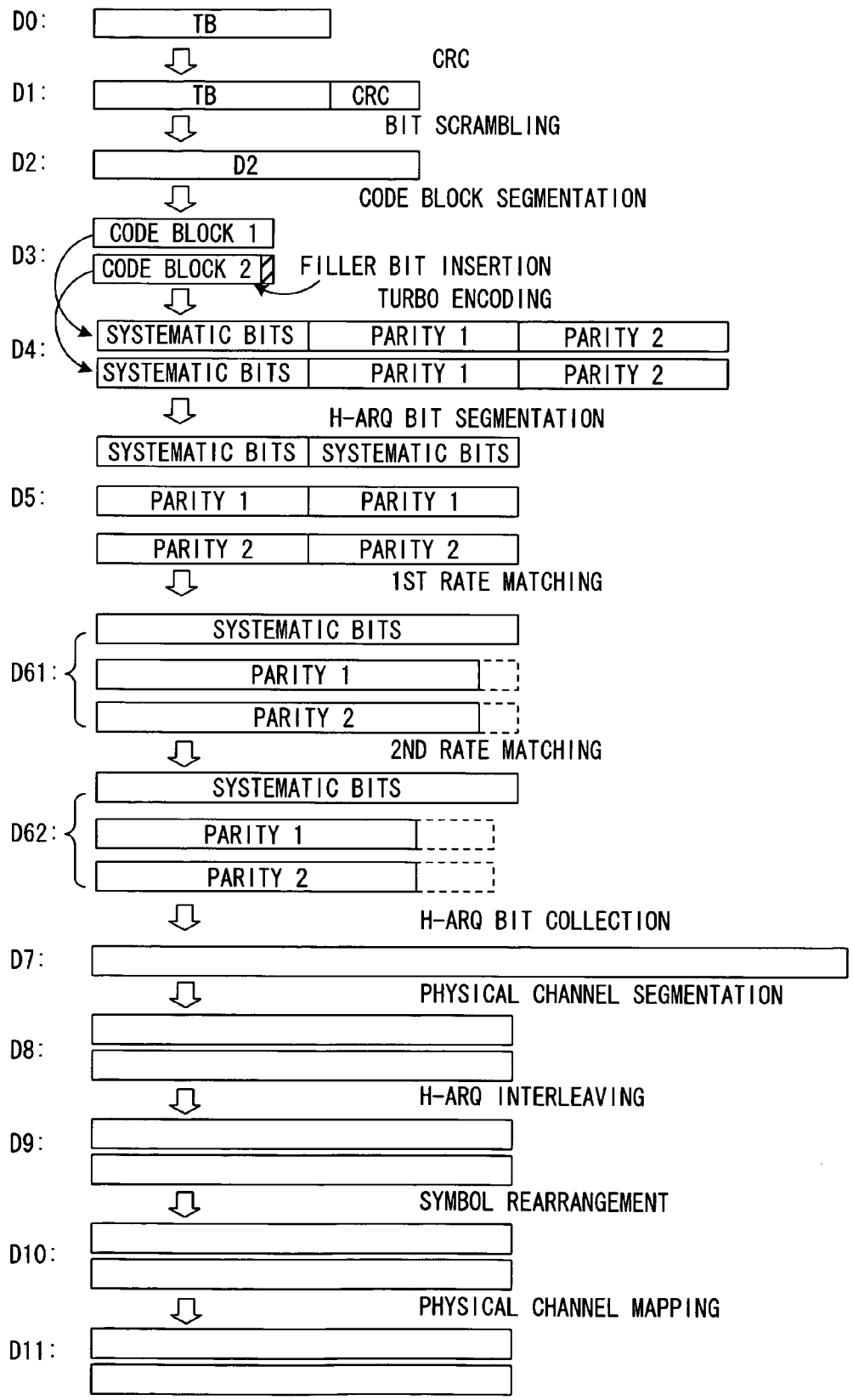
FIG. 42 is a data format used to explain transmission processing.
Figure 43:
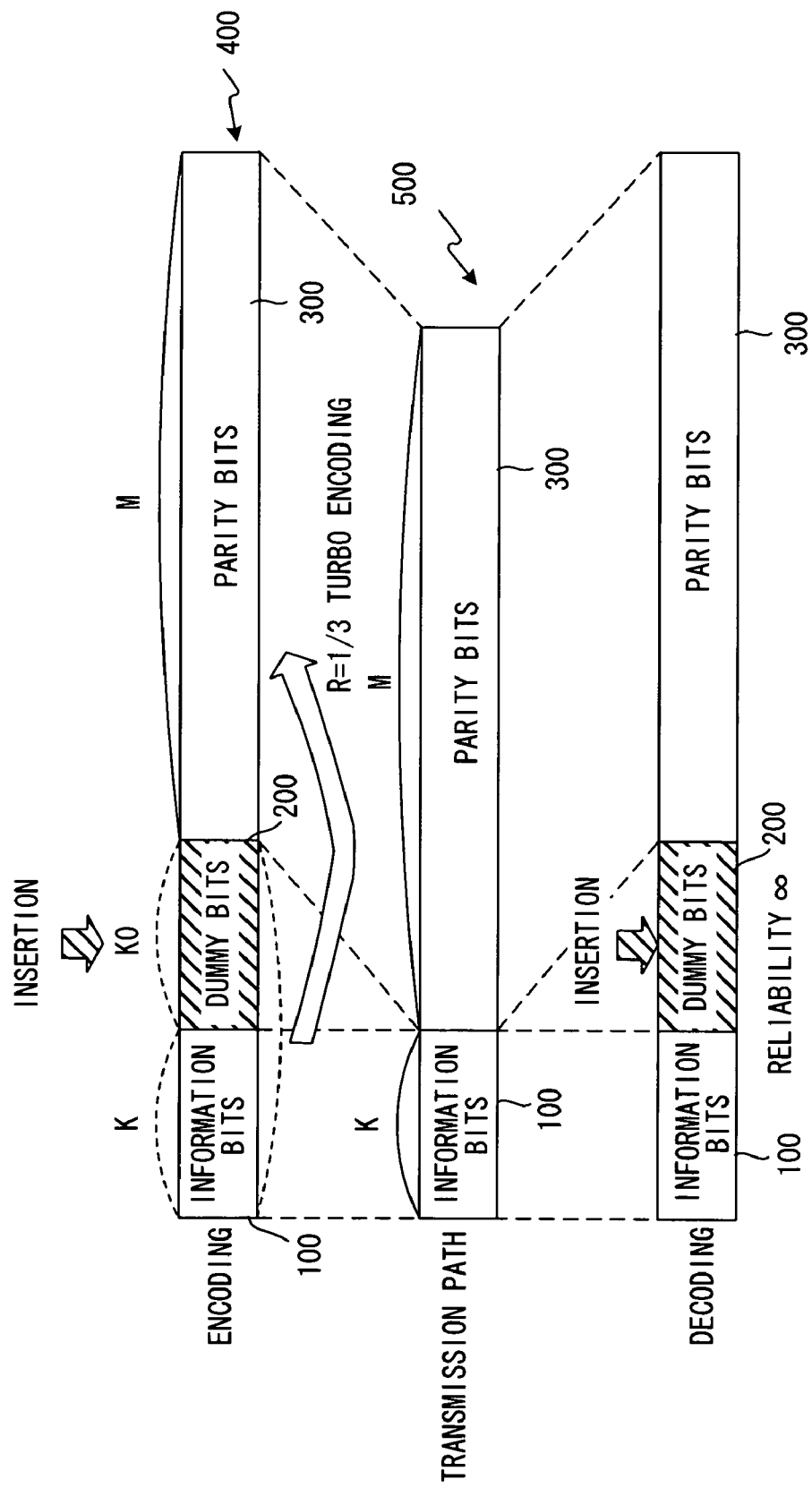
FIG. 43 explains an encoding/decoding method using dummy bits.
Figure 44:
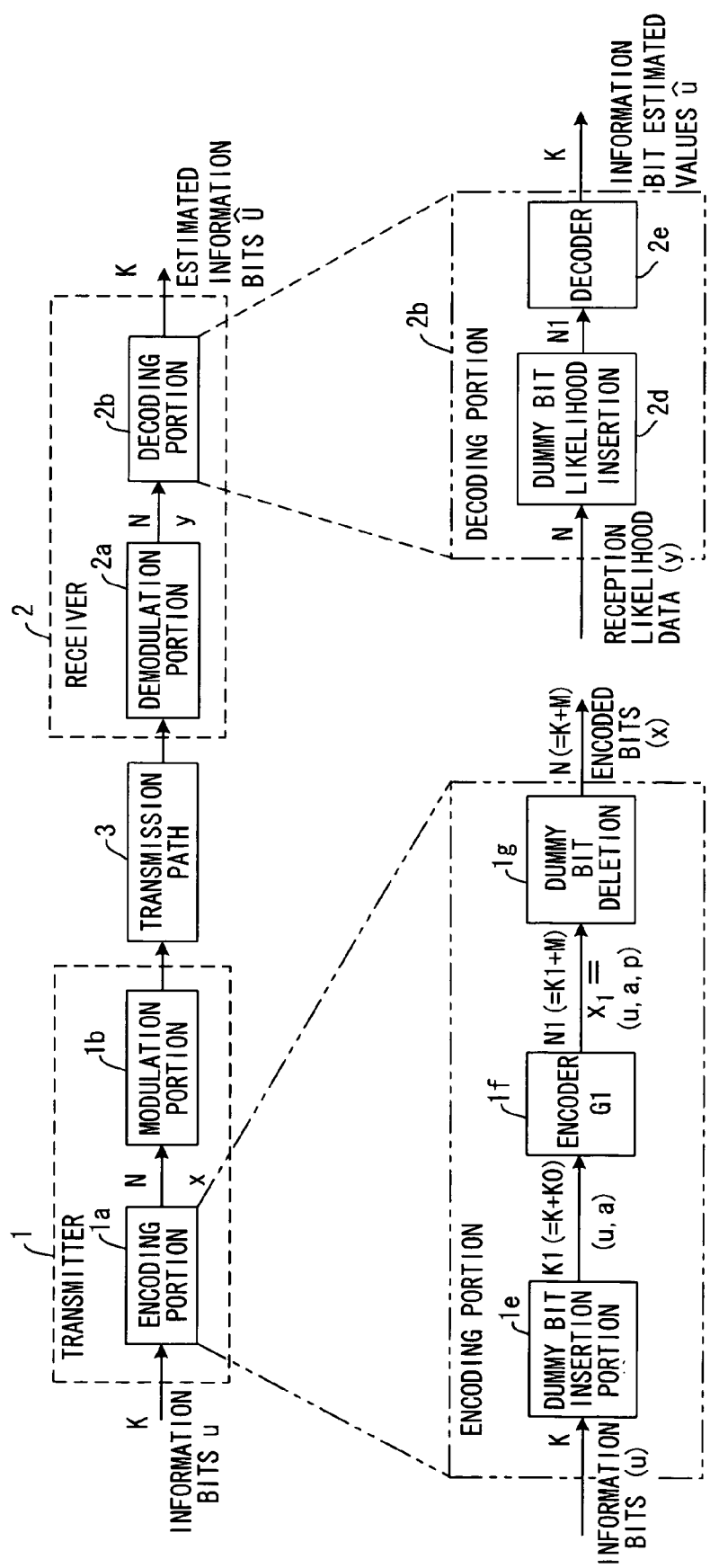
FIG. 44 shows the configuration of a communication system which realizes the encoding/decoding method of FIG. 43.

FIG. 1 shows the configuration of the transmission processing portion 30 of the wireless base station of a first embodiment; portions which are the same as in the transmission processing portion of the prior art shown in FIG. 41 are assigned the same symbols. The transmission processing portion 30 transmits information such as packets to a mobile station by means of the HSDPA shared channel HS-PDSCH.

The transmission processing portion 30 comprises a CRC addition portion 21; bit scrambling portion 22; code block segmentation portion 23; dummy bit insertion portion 31; channel coding portion (encoding portion) 24; physical layer HARQ function portion 25; physical channel segmentation portion 26; HS-PDSCH interleaving portion 27; constellation rearrangement portion 28; physical channel mapping portion 29; and transmission portion 32 which transmits information. The dummy bit insertion portion 31 is provided between the code block segmentation portion 23 and the encoding portion 24, and inserts dummy bits into information bits.

The physical layer HARQ function portion 25 comprises a bit segmentation portion 25a, first rate matching portion 25b, second rate matching portion 25c, and bit collection portion 25d. The first rate matching portion 25b comprises, in addition to rate matching portions 25b-1, 25b-2 for parity 1 and 2, a dummy bit deletion portion 25b-3, which deletes dummy bits from the systematic bits; similarly to the prior art, the second rate matching portion 25c comprises rate matching processing portions 25c-1, 25c-2 for parity 1 and 2, and a systematic bit rate matching processing portion 25c-3.

The dummy bit deletion portion 25b-3 deletes dummy bits which have been inserted into systematic bits by the dummy bit insertion portion 31. In the prior art, the first rate matching portion 25b passes systematic bits without performing any processing; but in the first embodiment, dummy bit deletion processing is performed by the dummy bit deletion portion 25b-3 simultaneously with puncturing of parity bits 1, 2 by the rate matching processing portions 25b-1 and 25b-2.

Figure 2:
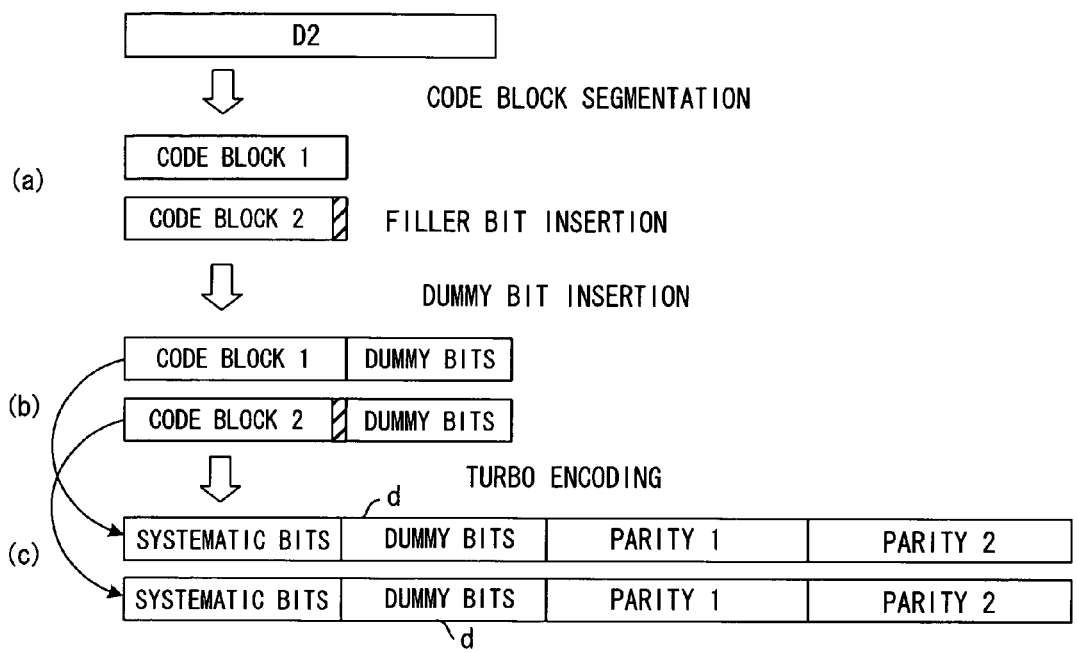
FIG. 2 explains dummy bit insertion processing in the first embodiment.
Figure 3:
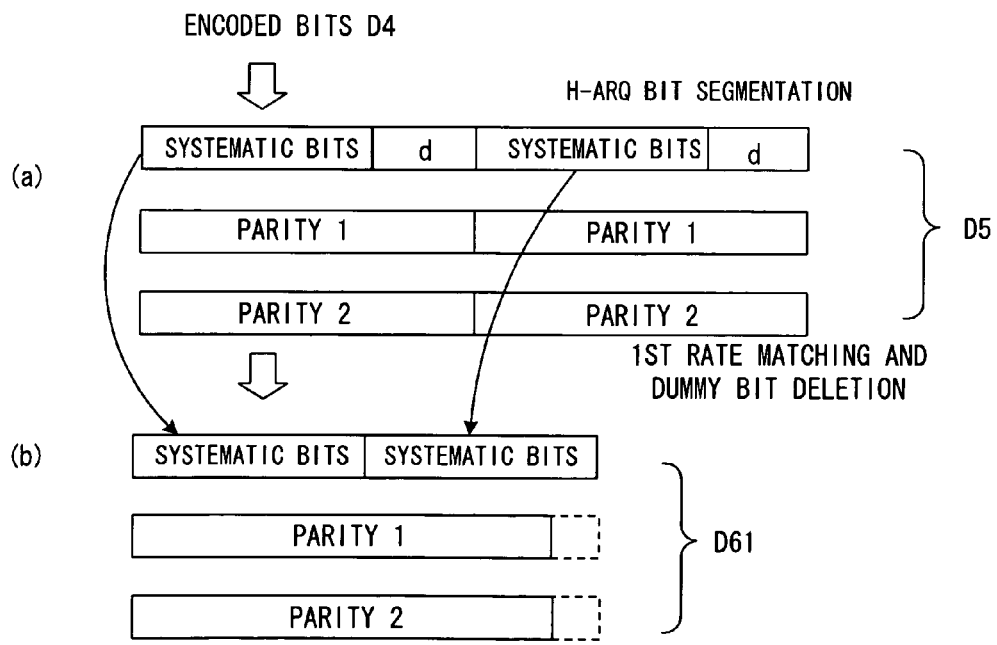
FIG. 3 explains dummy bit deletion processing in the first embodiment.

FIG. 2 explains dummy bit insertion processing, and FIG. 3 explains dummy bit deletion processing. The code block segmentation portion 23 performs code block segmentation of the data set D2 resulting from bit scrambling. That is, the dummy bit size K0 is determined from the specified code rate R, and using the result of comparison of the magnitudes of the total size K1 (=K+K0) of the information bit size K and dummy bit size K0 with a stipulated size Z, a judgment is made as to whether to perform code block segmentation. In turbo encoding, $40 \leqq K1 \leqq 5114$, so that Z=5114.

If the dummy bit size is K0 and the information bit size is K, then in the case of turbo encoding, when dummy bits are deleted and the data is transmitted, the code rate R is $$R=K/\{K+2(K+K0)\} \quad (1)$$

so that from the above equation, the dummy bit size K0 is calculated to be $$K0=(K-3KR)/2R \quad (2)$$

When the total size K1 (=K+K0) exceeds the stipulated size Z, the code block segmentation portion 23 determines the number of code blocks C and the code block size, and segments the data set D2 to obtain C (in the figure, C=2) code blocks 1, 2, which are a plurality of code blocks all of the same size ((a) in FIG. 2). When the data cannot be divided by the number of code blocks, filler bits are inserted to adjust the size. Filler bits have value "0", and are inserted at the beginning of the original data.

The dummy bit insertion portion 31 inserts dummy bits of size K0/2 into each code block ((b) in FIG. 2), the encoding portion 24 performs encoding, such as for example turbo encoding, of each code block with the dummy bits inserted ((c) of FIG. 2).

The bit segmentation portion 25a of the physical layer HARQ function portion 25 divides the code of each of the code blocks output from the encoding portion 24 into (1) systematic bits+dummy bits, (2) parity bits 1, and (3) parity bits 2, and concatenates bits of the same type (see (a) in FIG. 3). Then, the first rate matching portion 25b of the physical layer HARQ function portion 25 checks to determine whether the total bit length of data set D5 is greater than the stipulated buffer size NIR, and if greater, performs puncturing of parity bits 1 and parity bits 2 so that the size is the same as NIR, and at the same time deletes the dummy bits from the systematic bits ((b) in FIG. 3).

Next, the second rate matching portion 25c of the HARQ function portion 25 performs rate matching (repetition or puncturing) of the data set D61 of systematic bits and parity bits 1, 2 shown in (b) of FIG. 3, according to the specified H-ARQ transmission parameters. Thereafter, processing similar to that of the prior art is performed, and systematic code with the dummy bits deleted is transmitted. On the receiving side, the systematic code is received, then the dummy bits deleted on the transmitting side are inserted, as maximum-likelihood values, into the received systematic code, and thereafter turbo decoding is performed to obtain the information bits. In HSDPA, the information necessary for reception (address, modulation method, dummy bit size, dummy bit insertion method, and similar) is transmitted to the reception device in advance as necessary through the shared channel HS-SCCH. Hence in the reception device the positions of dummy bit insertion on the transmitting side are known, and so maximum-likelihood dummy bits are inserted at these positions and decoding is performed.

Figure 4:
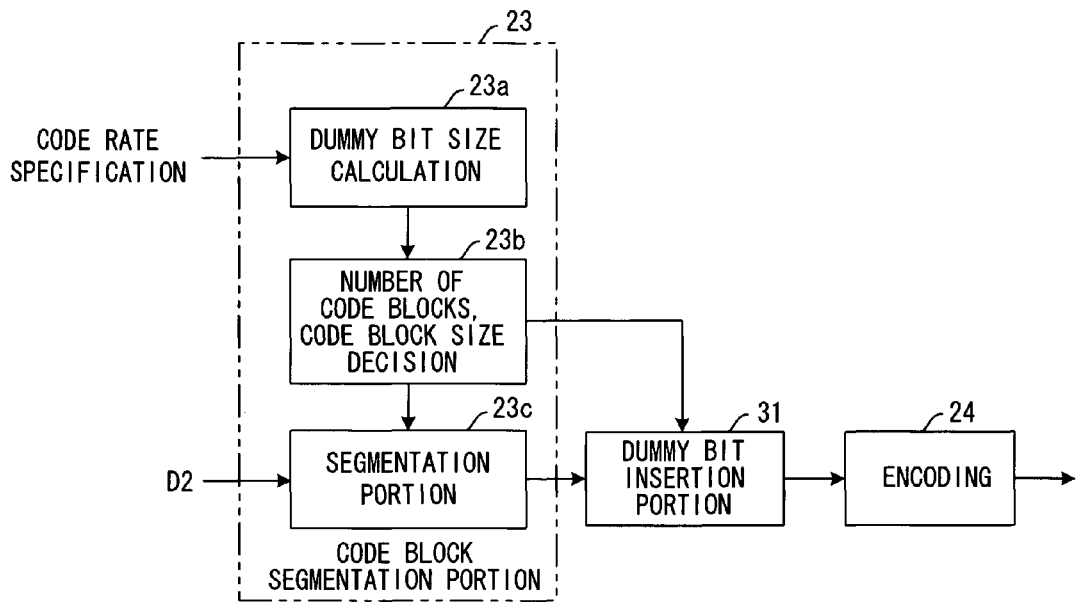
FIG. 4 shows the configuration of the code block segmentation portion in the first embodiment.

FIG. 4 shows the configuration of the code block segmentation portion 23; the dummy bit size calculation portion 23a calculates the size K0 of dummy bits based on the specified code rate R using the equation (2), the code block number/code block size judgment portion 23b decides the number of code blocks and the code block size based on the total size K1 (=K+K0) of the information bit size K and dummy bit size K0 as well as the stipulated size Z, the segmentation portion 23c segments the bit-scrambled data set D2 into the specified number of segments, the dummy bit insertion portion 31 inserts K0/2 dummy bits into each code block, and the encoding portion 24 performs encoding of each of the code blocks with dummy bits inserted.

By means of the first embodiment, the dummy bits are inserted into the information bits, then parity bits are added to the information bits into which the dummy bits are inserted by turbo encoding, thereafter the dummy bits are deleted from the turbo code to obtain systematic code which is transmitted; on the receiving side, the systematic code is received, then the dummy bits deleted on the transmitting side are added, as maximum-likelihood values, to the received systematic code, and thereafter turbo decoding is performed, so that decoding errors can be reduced.

Further, by means of the first embodiment, because the dummy bits are already separated from the systematic bits in the dummy bit deletion portion 25b-3, deletion of dummy bits from the systematic bits can easily be performed. Moreover, dummy bit deletion can be performed simultaneously with puncturing of the parity bits 1 and 2, so that dummy bit deletion does not affect the overall transmission processing time.

Modified Example

Figure 5:
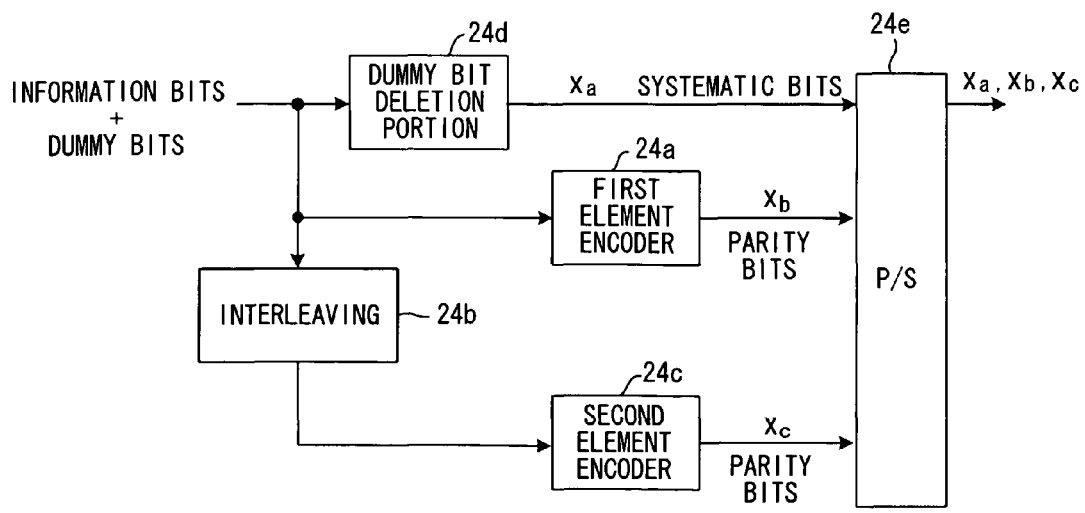
FIG. 5 shows the configuration of the turbo encoding portion.

In the above, a case was explained in which the dummy bits are deleted in the dummy bit deletion portion 25b-3 of the physical layer HARQ function portion 25; however, deletion can also be performed within the turbo encoder. FIG. 5 shows the configuration of a turbo encoder 24; 24a is a first element encoder which encodes information bits into which dummy bits have been inserted, 24b is an interleaving portion which interleaves information bits into which dummy bits have been inserted, 24c is a second element encoder which encodes the interleaving result, 24d is a dummy bit deletion portion which deletes dummy bits, and 24e is a P/S conversion portion which converts the outputs of the element encoders 24a, 24b and the dummy bit deletion portion 24d into serial data. By deleting dummy bits within the turbo encoder as explained above, the dummy bits can easily be deleted from the systematic bits.

(B) Second Embodiment

In the second embodiment, dummy bits are inserted such that the code rate is a fixed value to perform encoding, and the entire bit size of the transmission data is fixed at Ndata. Here however Ndata is equal to the number of codes times the physical channel size.

Figure 6:
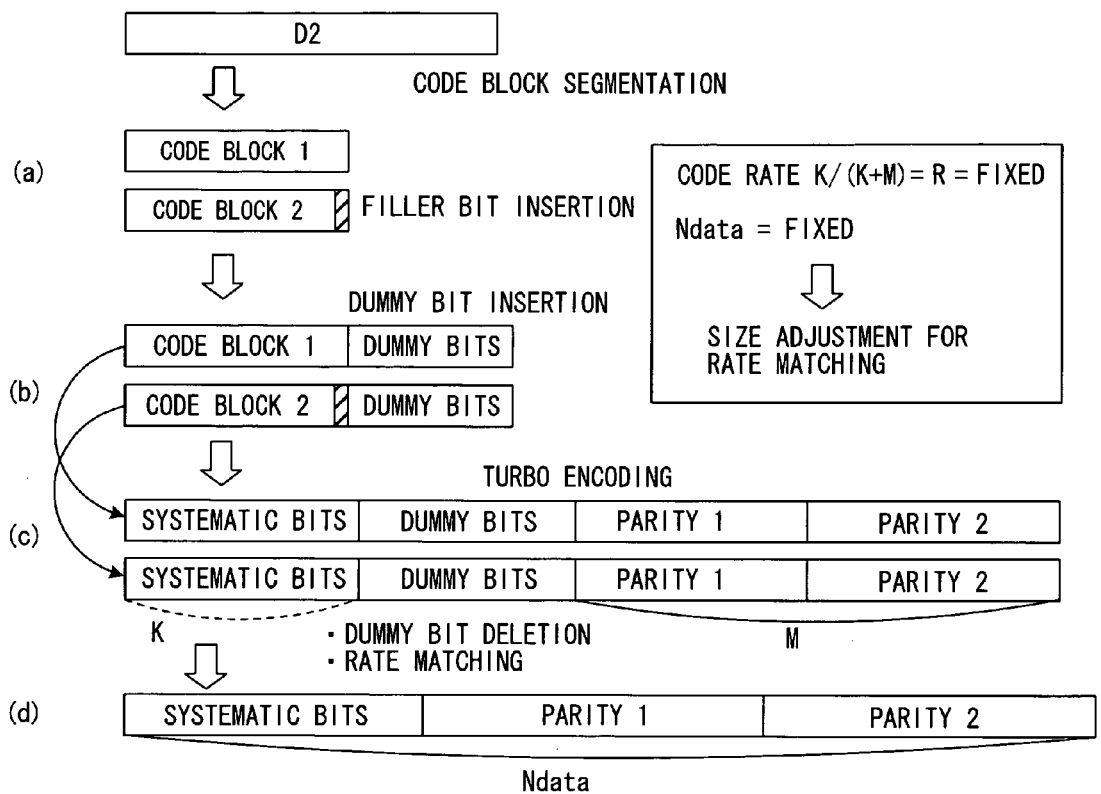
FIG. 6 explains dummy bit insertion processing in the wireless base station of a second embodiment.

FIG. 6 explains dummy bit processing in the wireless base station of the second embodiment; the configuration of the transmission processing portion is the same as that of the first embodiment in FIG. 1.

Similarly to the first embodiment, the code block segmentation portion 23 performs code block segmentation of the data set D2 which has been subjected to bit-scrambling. That is, the dummy bit size K0 resulting in the stipulated code rate R is determined, and by comparing the magnitudes of the total size K1 (=K+K0) of the information bit size K and dummy bit size K0 with the stipulated size Z, a judgment is made as to whether code block segmentation is necessary, and code block segmentation is performed ((a) in FIG. 6).

The dummy bit insertion portion 31 inserts K0/2 dummy bits into each code block ((b) in FIG. 6), and the encoding portion 24 performs encoding of each code block with dummy bits inserted, by for example performing turbo encoding ((c) in FIG. 6).

The first rate matching portion 25b of the physical layer HARQ function portion 25 checks whether the code bit length is greater than the stipulated buffer size NIR, and if greater, performs puncturing of parity bits 1 and parity bits 2 such that the size is the same as NIR, and simultaneously deletes dummy bits from the systematic bits. Then, the second rate matching portion 25c of the physical layer HARQ function portion 25 performs rate matching (repetition or puncturing) such that the code length is equal to Ndata ((d) in FIG. 6). Thereafter, processing similar to that of the prior art is performed, and systematic code not containing dummy bits is transmitted. On the receiving side, the systematic code is received, the dummy bits deleted on the transmitting side are inserted into the systematic code as maximum-likelihood values, turbo decoding is performed, and the information bits are acquired.

Figure 7:
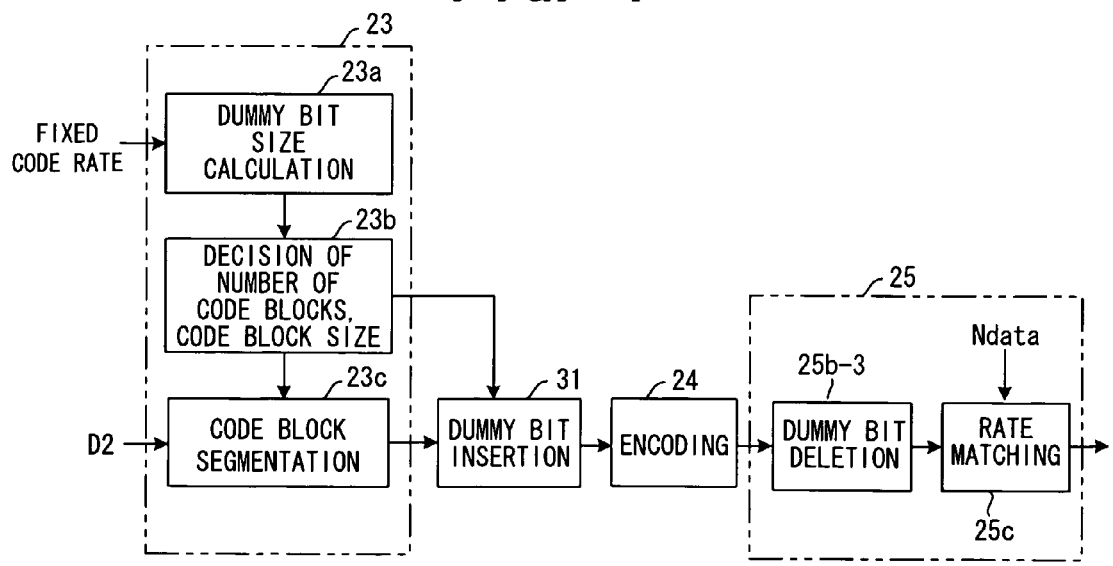
FIG. 7 is a block diagram of principal portions of the second embodiment.

FIG. 7 is a block diagram of principal portions of the transmission processing portion of the second embodiment; portions which are the same as in the first embodiment of FIG. 4 are assigned the same symbols. A difference is the addition of a physical layer HARQ function portion 25, having a dummy bit deletion portion and a second rate matching portion.

Figure 8:
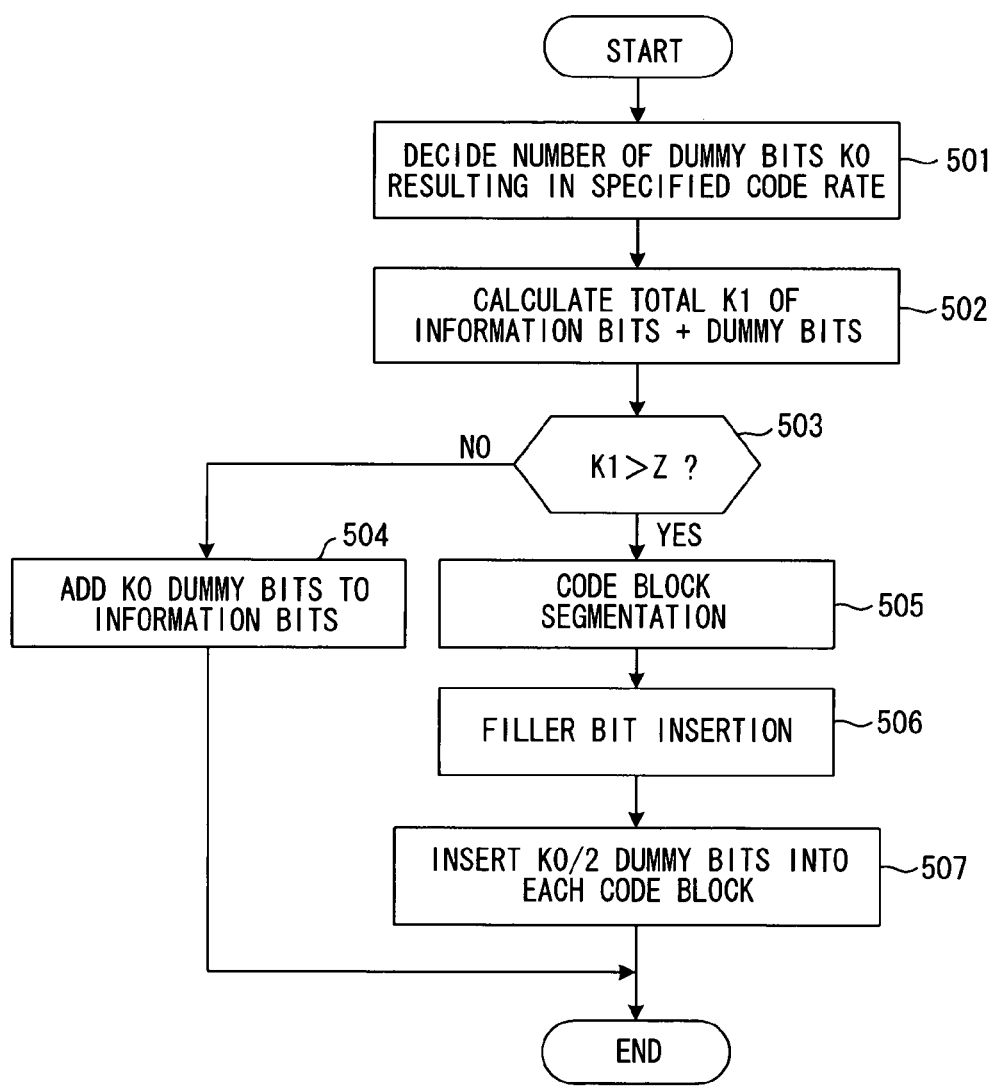
FIG. 8 shows the flow of dummy bit insertion processing in the second embodiment.

FIG. 8 shows the flow of dummy bit insertion processing in the second embodiment. The size K0 of dummy bits is decided such that the code rate R is the stipulated rate (step 501), the total size K1 (=K+K0) of the information bit size K and dummy bit size K0 is calculated (step 502), the magnitudes of the total size K1 and the stipulated size Z are compared (step 503), and if K1≦Z the code block is not segmented, and K0 dummy bits are inserted into the information bits (step 504), and dummy bit insertion processing ends. If on the other hand K1>Z, the number of code blocks/code block size are decided, and code block segmentation is performed (step 505). Then, filler bits are inserted (step 506), and K0/C dummy bits are inserted into each code block (where C is the number of code blocks; if C=2, then K0/2 dummy bits are inserted) (step 507), and dummy bit insertion processing ends.

Figure 9:
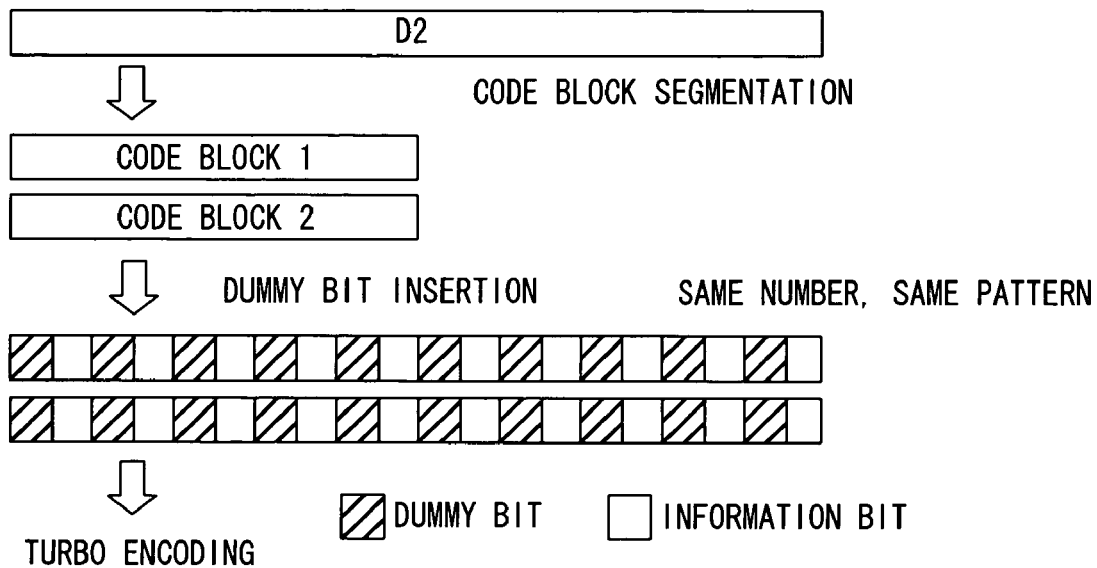
FIG. 9 explains the method of dummy bit insertion after code segmentation in the second embodiment.

FIG. 9 explains the dummy bit insertion method after code segmentation. When dummy bit are inserted, the dummy bit insertion positions and dummy bit values (0,1) are made the same, such that the same number of dummy bits are allocated uniformly to each of the code blocks.

Figure 10:
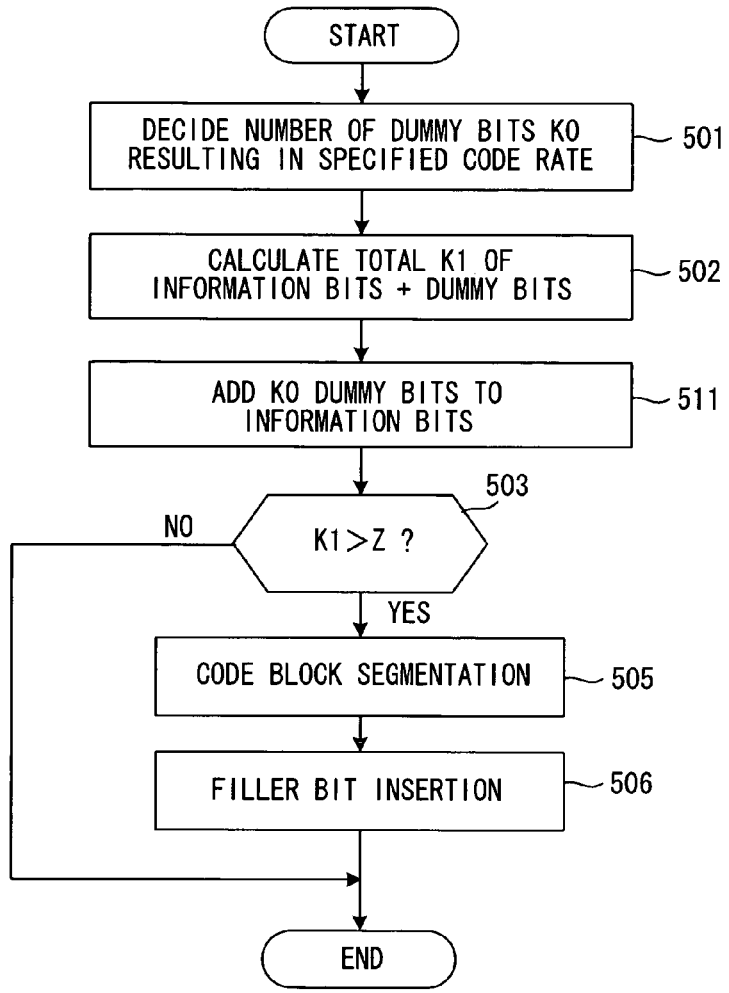
FIG. 10 shows the flow of dummy bit insertion processing in the second embodiment.

By the way, FIG. 8 is for a case in which dummy bits are inserted after code block segmentation; when it is necessary to insert dummy bits before code block segmentation and then perform segmentation, code block segmentation can be performed such that dummy bits are distributed uniformly to each of the code blocks. FIG. 10 shows the flow of dummy bit insertion in this embodiment; the step of processing to insert dummy bits (step 511) is positioned before step 503 to compare the magnitudes of the total size K1 and the stipulated size Z.

Figure 11:
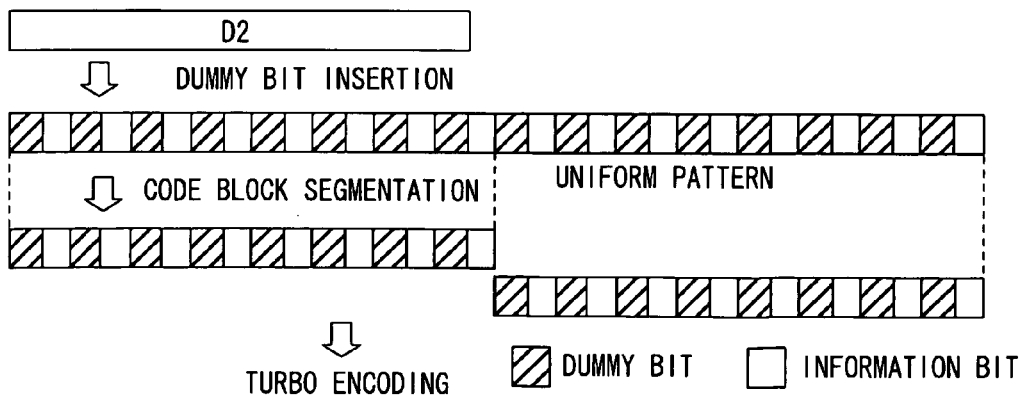
FIG. 11 explains the insertion method of inserting dummy bits before code segmentation.

FIG. 11 explains the insertion method for inserting dummy bits prior to segmentation; dummy bits are inserted such that there is no deviation in dummy bit placement of each code block, and moreover dummy bit insertion positions are uniform in each code block when code block segmentation is performed.

By means of the above second embodiment, the dummy bit size is decided such that the required code rate is obtained, and moreover rate matching can be performed and data transmitted such that the Ndata given by the H-ARQ transmission parameters is achieved. And, by uniformly inserting dummy bits, decoding characteristics can be improved.

The dummy bit insertion method of FIG. 9 and FIG. 11 is not limited to the second embodiment, but can be applied to all the embodiments.

(C) Third Embodiment

Figure 12:
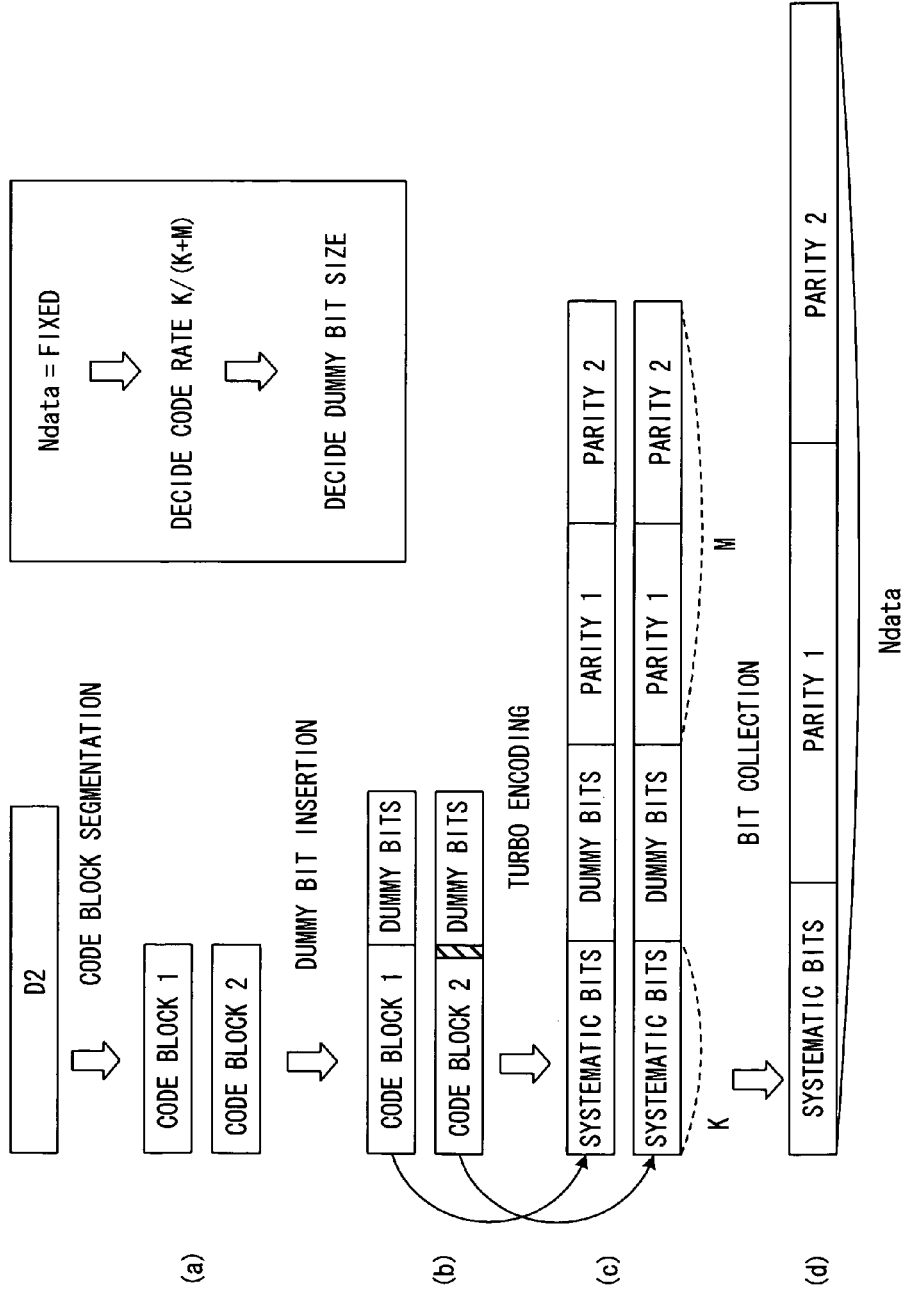
FIG. 12 explains the dummy bit insertion processing of a third embodiment.
Figure 13:
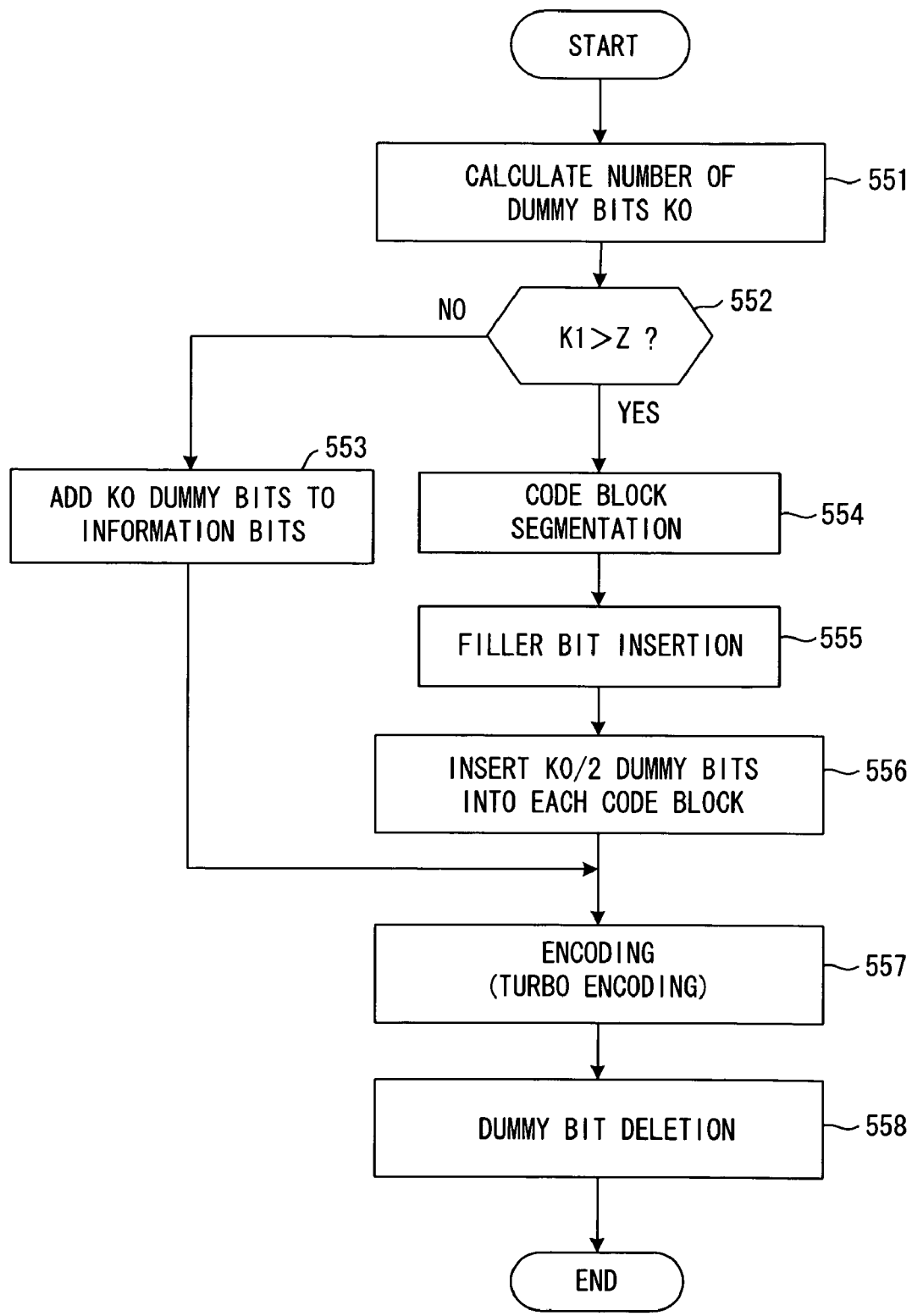
FIG. 13 shows the flow of dummy bit insertion processing in the third embodiment.

The third embodiment is an example in which dummy bits are inserted such that the code total bit length is equal to Ndata. FIG. 12 explains dummy bit insertion processing in the third embodiment, and FIG. 13 shows the flow of dummy bit insertion processing; the configuration of the transmission processing portion is the same as that of the first embodiment in FIG. 1.

The code block segmentation portion 23 calculates the size K0 of dummy bits to be inserted such that the total bit length is equal to Ndata (step 551). When dummy bits of size K0 are inserted into information bits of size K, turbo encoding is performed, the dummy bits are deleted and the result is transmitted, the code size is K+2(K+K0). Hence the equation $$N\text{data}=K+2(K+K0) \quad (3)$$

obtains, and the dummy bit size K0 is $$K0=(N\text{data}-3K)/2 \quad (4)$$

Next, the size K1=K+K0 of information bits with dummy bits inserted is compared with the stipulated size Z (=5114) (step 552), and if K1≦Z, code block segmentation is not performed, and K0 dummy bits are inserted into the information bits (step 553), and dummy bit insertion processing ends. If on the other hand K1>Z, then the number of code blocks and code block size are decided, and code block segmentation is performed ((a) in FIG. 12; step 554). Then, filler bits are inserted (step 555), and K0/C (where C is the number of code blocks; if C=2, then K0/2) dummy bits are inserted into each code block ((b) in FIG. 12; step 556), and dummy bit insertion processing ends.

The encoding portion 24 performs encoding of each code block with dummy bits inserted, by for example performing turbo encoding ((c) in FIG. 12; step 557). Then, the physical layer HARQ function portion 25 deletes the dummy bits from the systematic bits ((d) in FIG. 12; step 558). The code length after deleting the dummy bits is equal to Ndata, and so the physical layer HARQ function portion 25 does not perform rate matching (repetition or puncturing).

Thereafter, processing similar to that of the prior art is performed, and systematic code with dummy bits deleted is transmitted. On the receiving side, the systematic code is received, the dummy bits which had been deleted on the transmitting side are inserted into the received systematic code as maximum-likelihood values, and turbo decoding is performed to obtain the information bits.

In the third embodiment, dummy bits can be inserted and transmission is performed such that the code rate R (=K/Ndata) is variable, and moreover such that the code length is equal to Ndata.

(D) Fourth Embodiment

Figure 14:
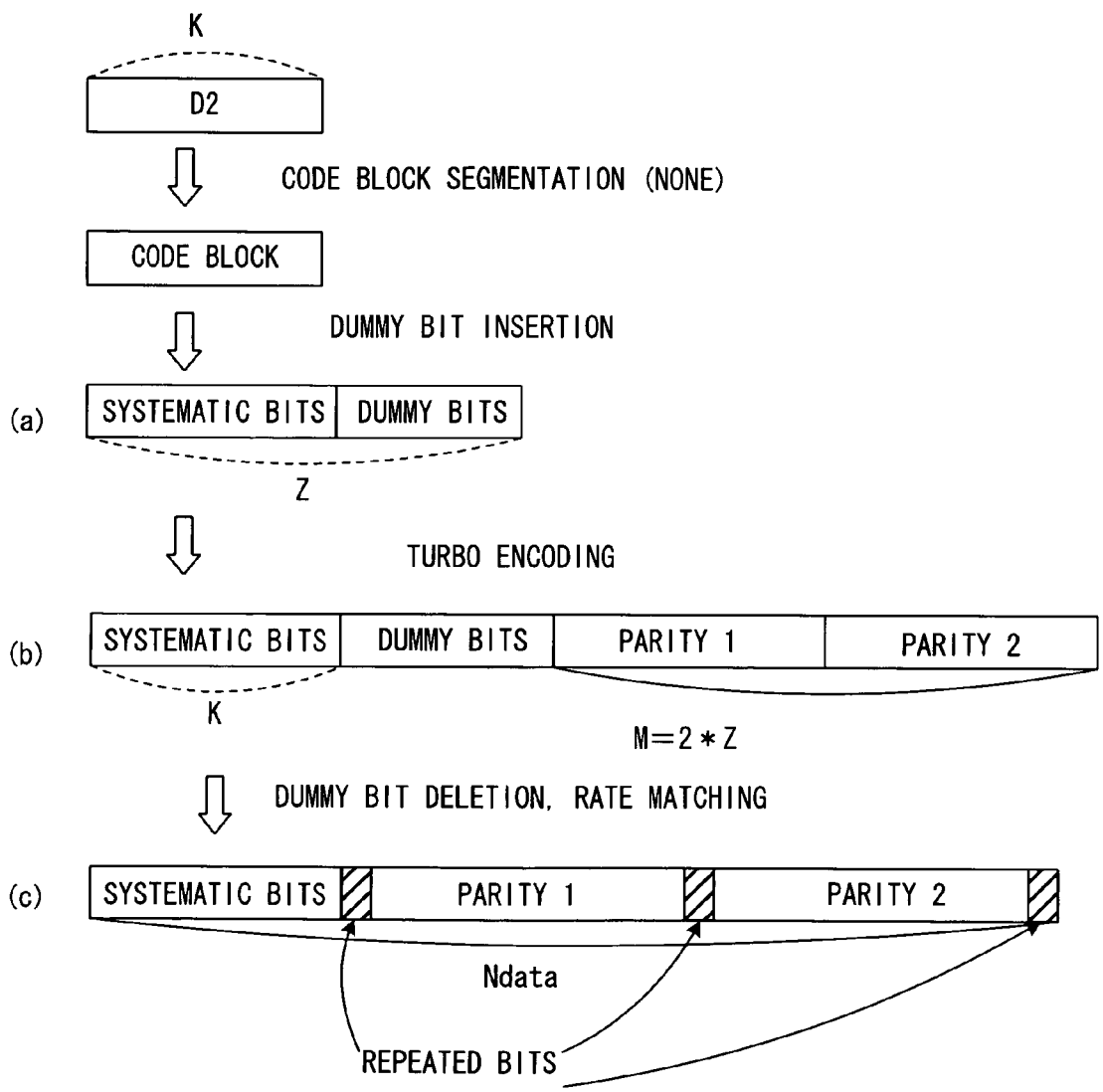
FIG. 14 explains the dummy bit insertion processing of a fourth embodiment.
Figure 15:
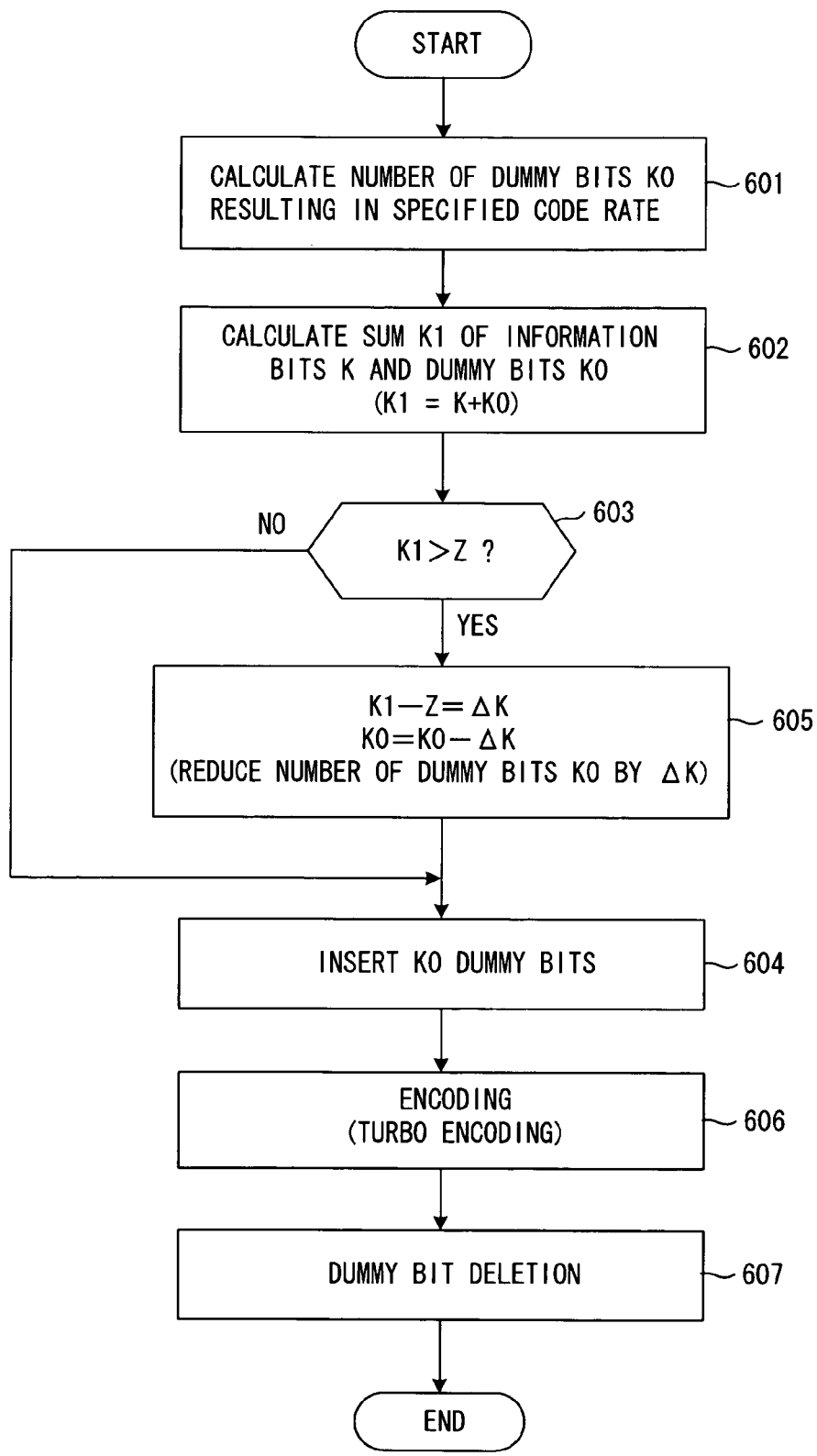
FIG. 15 shows the flow of dummy bit insertion processing in the fourth embodiment.

The fourth embodiment is an embodiment in which code block segmentation is not performed (the number of code blocks is 1). FIG. 14 explains dummy bit insertion processing in the fourth embodiment; FIG. 15 shows the flow of dummy bit insertion processing, in which the transmission processing portion has the same configuration as in the first embodiment in FIG. 1.

When the size K1 (=K+K0) resulting from combining the dummy bit size K0 determined from the specified code rate and the information bit size K exceeds a stipulated size Z, in the fourth embodiment, the dummy bit size is adjusted such that the total size K1 is equal to the stipulated size Z.

The code block segmentation portion 23 decides the dummy bit size K0 using equation (2) such that the code rate is the stipulated code rate R (step 601), calculates the total size K1 (=K+K0) of the information bits K and dummy bit K0 (step 602), and compares the magnitudes of the total size K1 and the stipulated size Z (step 603).

If K1≦Z, dummy bits of size K0 are inserted into the information bits of size K ((a) in FIG. 14; step 604). On the other hand, if K1>Z, the amount ΔK by which the stipulated size Z is exceeded is calculated using the equation $$\Delta K = K1 - Z \quad (5)$$

and the dummy bit size K0 is modified according to the equation $$K0 = K0 - \Delta K$$

(step 605). Then, dummy bits of size K0 are inserted into the information bits of size K ((a) in FIG. 14; step 604).

When the above dummy bit insertion processing is completed, the encoding portion 24 encodes the code block with dummy bits inserted, by for example performing turbo encoding ((b) in FIG. 14; step 606). And, the physical layer HARQ function portion 25 deletes the dummy bits from the systematic bits, and performs rate matching such that the code length is equal to Ndata ((c) in FIG. 14; step 607).

Thereafter processing similar to that of the prior art is performed, and systematic code without dummy bits is transmitted. On the receiving side, the systematic code is received, the dummy bits which had been deleted on the transmitting side are inserted into the received systematic code as maximum-likelihood values, turbo decoding is performed, and the information bits are obtained.

By means of the fourth embodiment, the maximum number of dummy bits can be inserted and the code length made equal to Ndata to perform transmission even when code block segmentation is not performed. Consequently, the effect of dummy bit insertion can be enhanced in a case where code block segmentation is not performed.

(E) Fifth Embodiment

Figure 16:
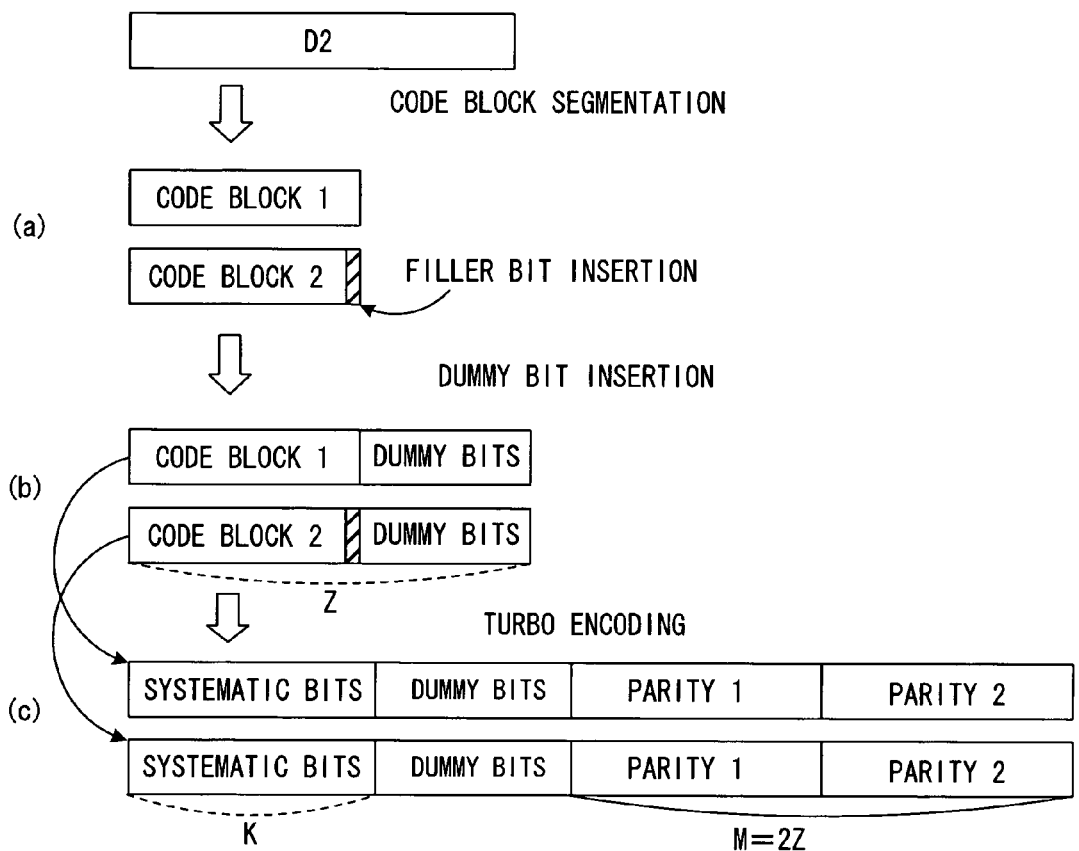
FIG. 16 explains the dummy bit insertion processing of a fifth embodiment.
Figure 17:
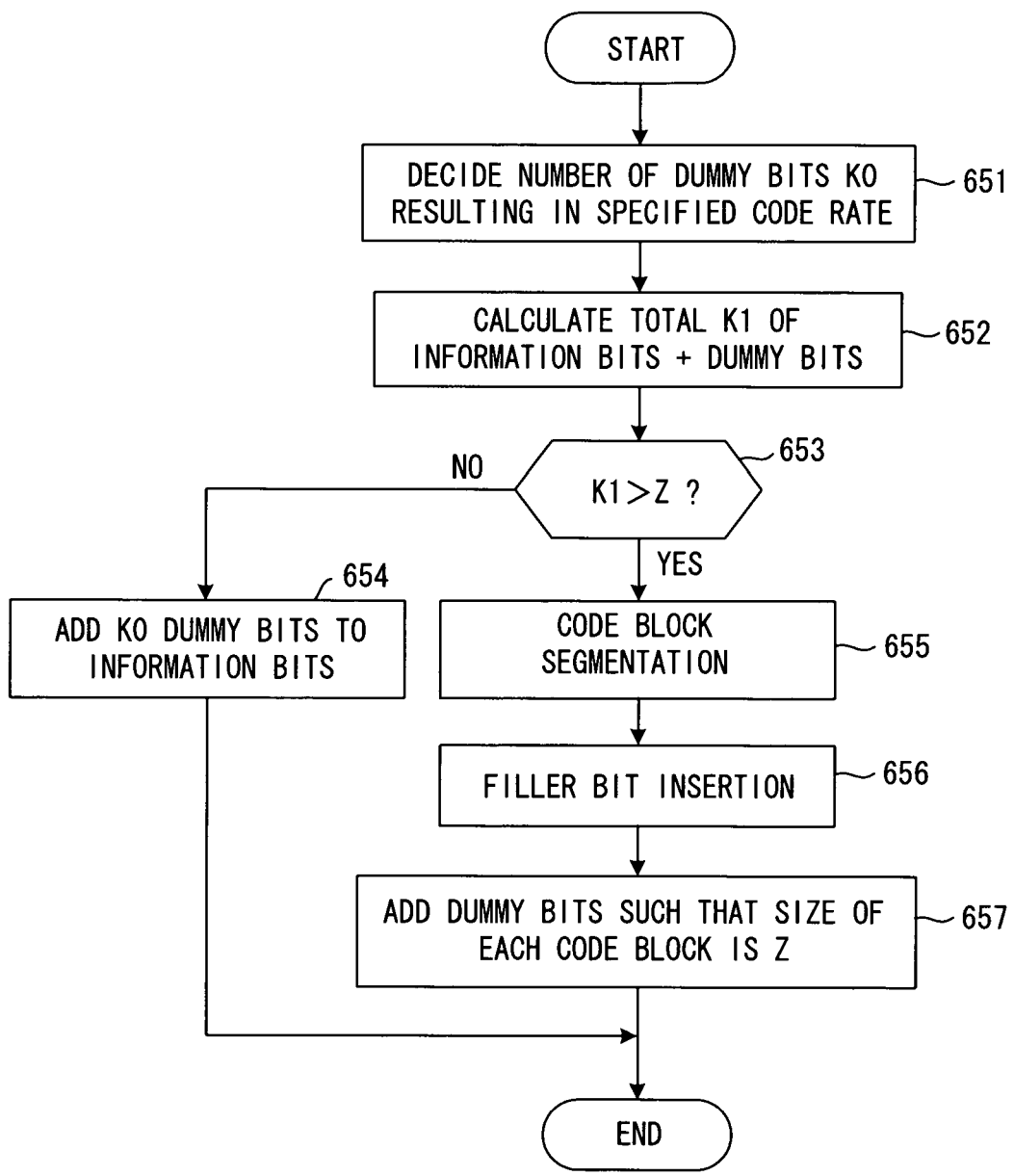
FIG. 17 shows the flow of dummy bit insertion processing in the fifth embodiment.

The fifth embodiment is an embodiment in which, when code block segmentation is performed, the dummy bit size is decided such that the total size in each code block of dummy bits and information bits is a stipulated size Z. FIG. 16 explains the dummy bit insertion processing of the fifth embodiment, and FIG. 17 shows the flow of dummy bit insertion processing; the configuration of the transmission processing portion is the same as in the first embodiment of FIG. 1.

The code block segmentation portion 23 decides the dummy bit size K0 using equation (2) such that the code rate is the stipulated code rate R (step 651), calculates the total size K1 (=K+K0) of the information bit size K and dummy bit size K0 (step 652), and compares the magnitudes of the total size K1 and the stipulated size Z (step 653).

If K1≦Z, K0 dummy bits are inserted into the information bits of size K (step 654). Moreover, dummy bits can be inserted such that the code block size is the stipulated size Z.

On the other hand, if K1>Z, the number of code blocks and code block size are decided, and code block segmentation is performed ((a) in FIG. 16; step 655). Then, filler bits are inserted (step 656), dummy bits are inserted such that the size of each code block is equal to the stipulated size Z ((b) in FIG. 16; step 657), and the dummy bit insertion processing ends.

The encoding portion 24 performs turbo encoding, for example, of each of the code blocks with dummy bits inserted ((c) in FIG. 16). The physical layer HARQ function portion 25 deletes the dummy bits from the systematic bits, and performs rate matching such that the code length is equal to Ndata.

Thereafter, processing similar to that of the prior art is performed, and systematic code without dummy bits is transmitted. On the receiving side, the systematic code is received, the dummy bits which had been deleted on the transmitting side are inserted into the received systematic code as maximum-likelihood values, turbo decoding is performed, and the information bits are obtained.

By means of the fifth embodiment, dummy bits are inserted such that the total size of dummy bits and information bits in each code block is equal to the stipulated size Z, encoding is performed, the dummy bits are deleted, and the data is transmitted. In this case, the size of the inserted dummy bits can be made large, so that the effect of dummy bit insertion can be enhanced.

(F) Sixth Embodiment

Figure 18:
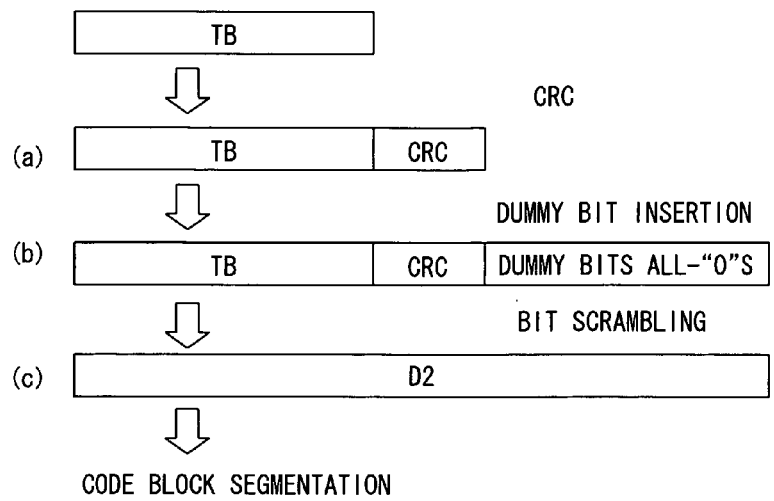
FIG. 18 explains the dummy bit insertion processing of a sixth embodiment.
Figure 19:
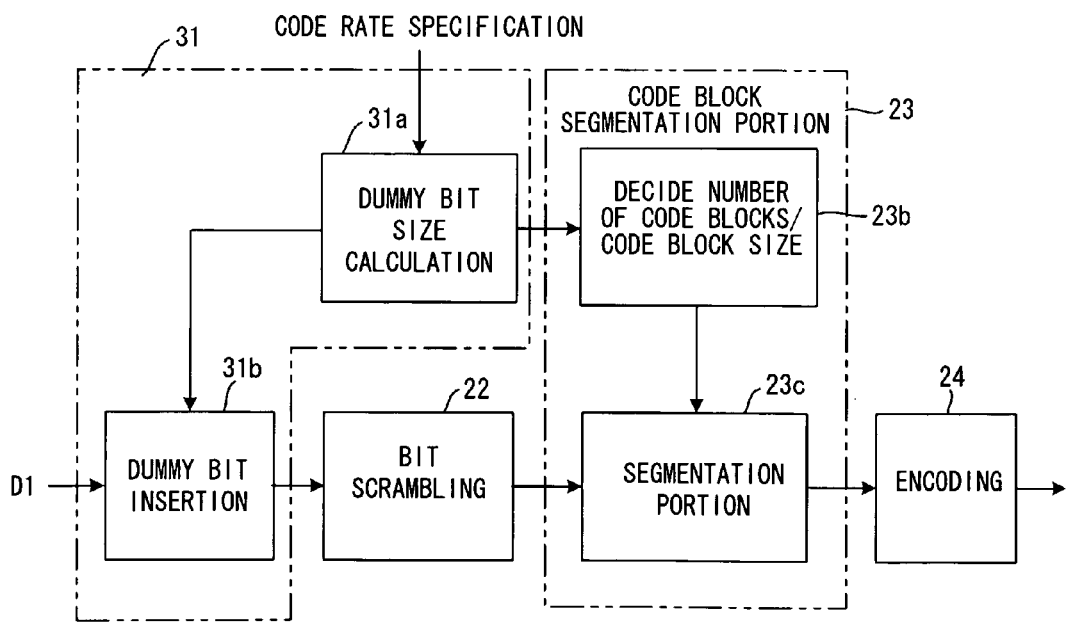
FIG. 19 is a block diagram of principal portions of the transmission processing portion in the sixth embodiment.
Figure 20:
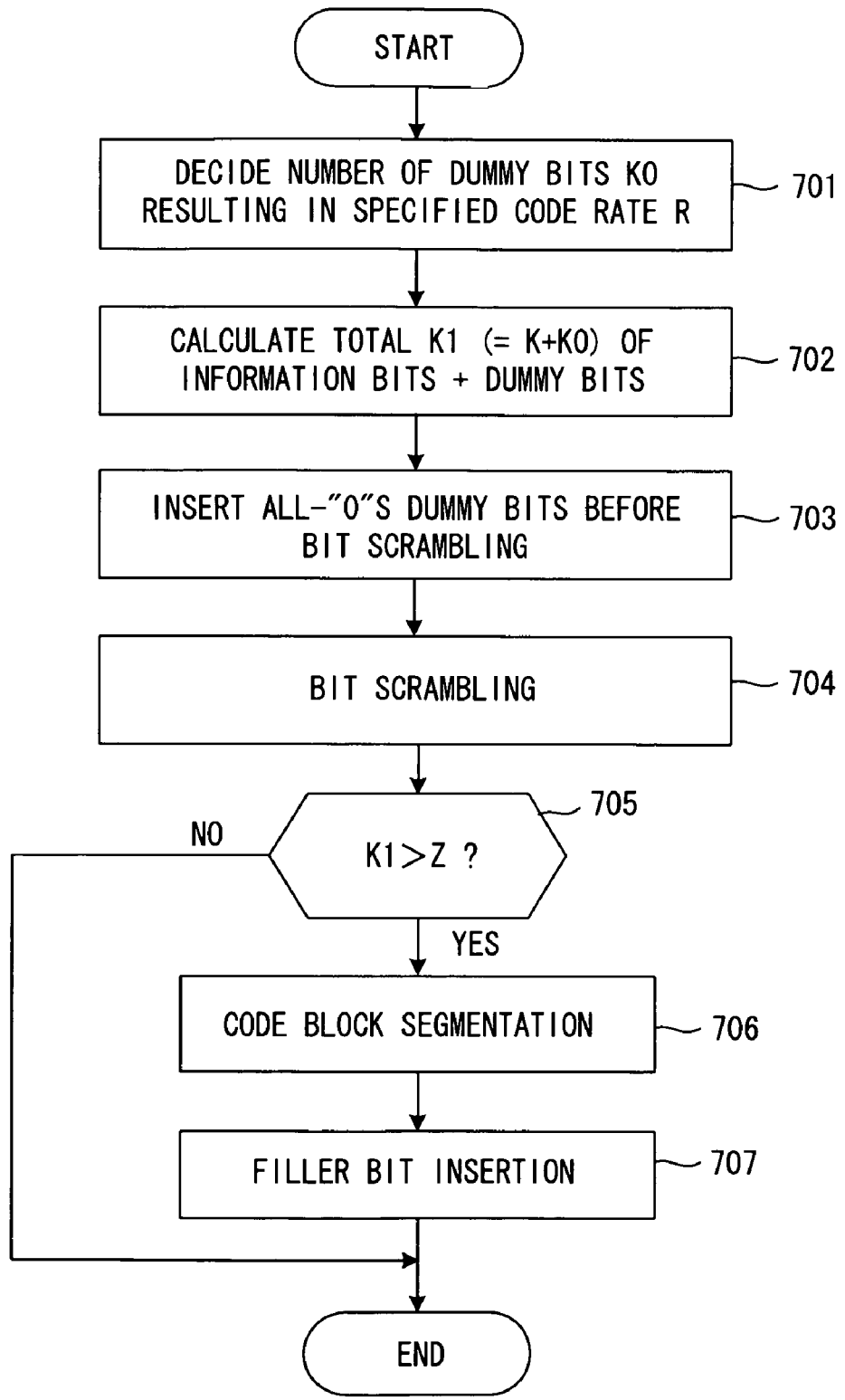
FIG. 20 shows the flow of dummy bit insertion processing in the sixth embodiment.

The sixth embodiment is an embodiment in which dummy bits are inserted before bit scrambling; FIG. 18 explains dummy bit insertion, FIG. 19 is a block diagram of principal portions of the transmission processing portion, and FIG. 20 shows the flow of dummy bit insertion processing.

The dummy bit size calculation portion 31a of the dummy bit insertion portion 31 decides the dummy bit size K0 using equation (2) such that the code rate is the stipulated code rate R (step 701) and calculates the total size K1 (=K+K0) of the information bit size K and dummy bit size K0 (step 702), and the dummy bit insertion portion 31b inserts, into the information bits ((a) of FIG. 18) with CRC bits added by the CRC addition portion 21, all-"0"s dummy bits ((b) in FIG. 18; step 703). Dummy bits need not be all-"0"s bits. Next, the bit scrambling portion 22 performs bit scrambling of information bits with dummy bits inserted, and inputs the result to the code block segmentation portion 23 ((c) in FIG. 18; step 704).

The code block number/code block size judgment portion 23b of the code block segmentation portion 23 compares the magnitudes of the size K1 (=K+K0) of the bit-scrambled data set D2 (the total size of the information bits and dummy bits) and a stipulated size Z (step 705).

If K1≦Z, code segmentation is not performed; if on the other hand K1>Z, the number of code blocks and code block size are decided, and the segmentation portion 23c performs code block segmentation (step 706). Then, filler bits are inserted (step 707).

Thereafter, similarly to the first embodiment, the encoding portion 24 performs turbo encoding of each of the code blocks with dummy bits inserted, and the physical layer HARQ function portion 25 deletes dummy bits and performs prescribed rate matching, and transmits systematic code without dummy bits. On the receiving side, the systematic code is received, the dummy bits which had been deleted on the transmitting side are inserted as maximum-likelihood values into the received systematic code, turbo decoding is performed, and the information bits are obtained.

By means of the sixth embodiment, dummy bits can be inserted prior to bit scrambling.

(G) Seventh Embodiment

Figure 21:
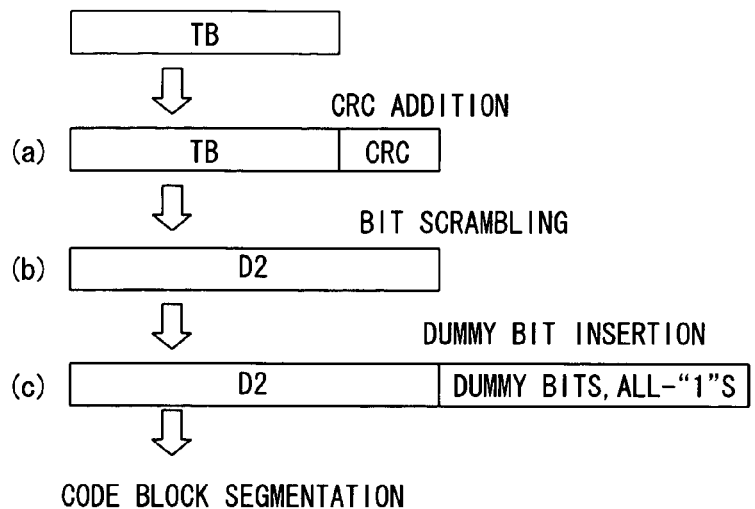
FIG. 21 explains dummy bit insertion in a seventh embodiment.
Figure 22:
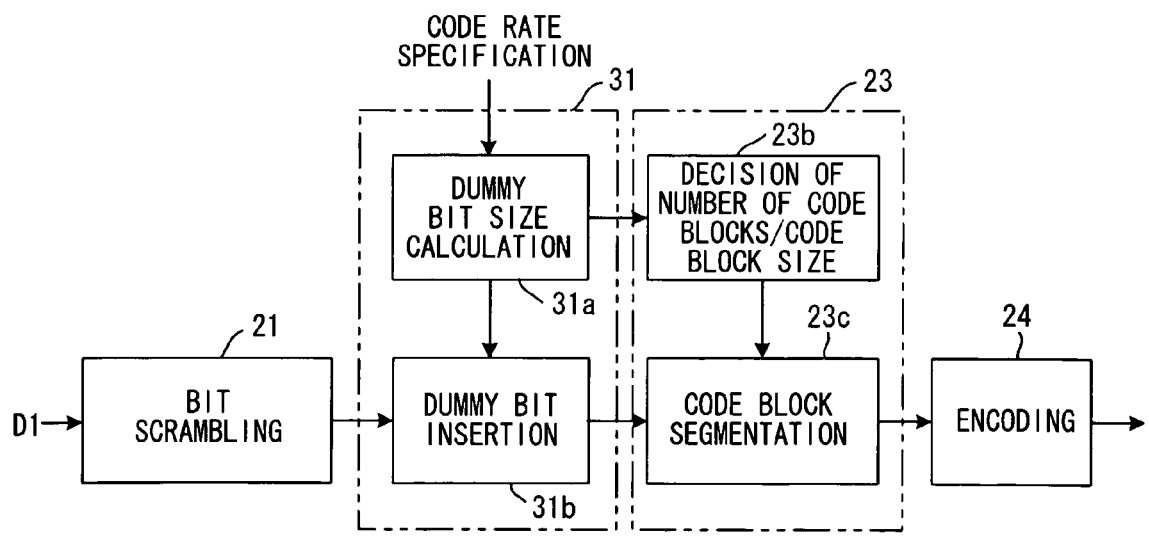
FIG. 22 is a block diagram of principal portions of the transmission processing portion in the seventh embodiment.
Figure 23:
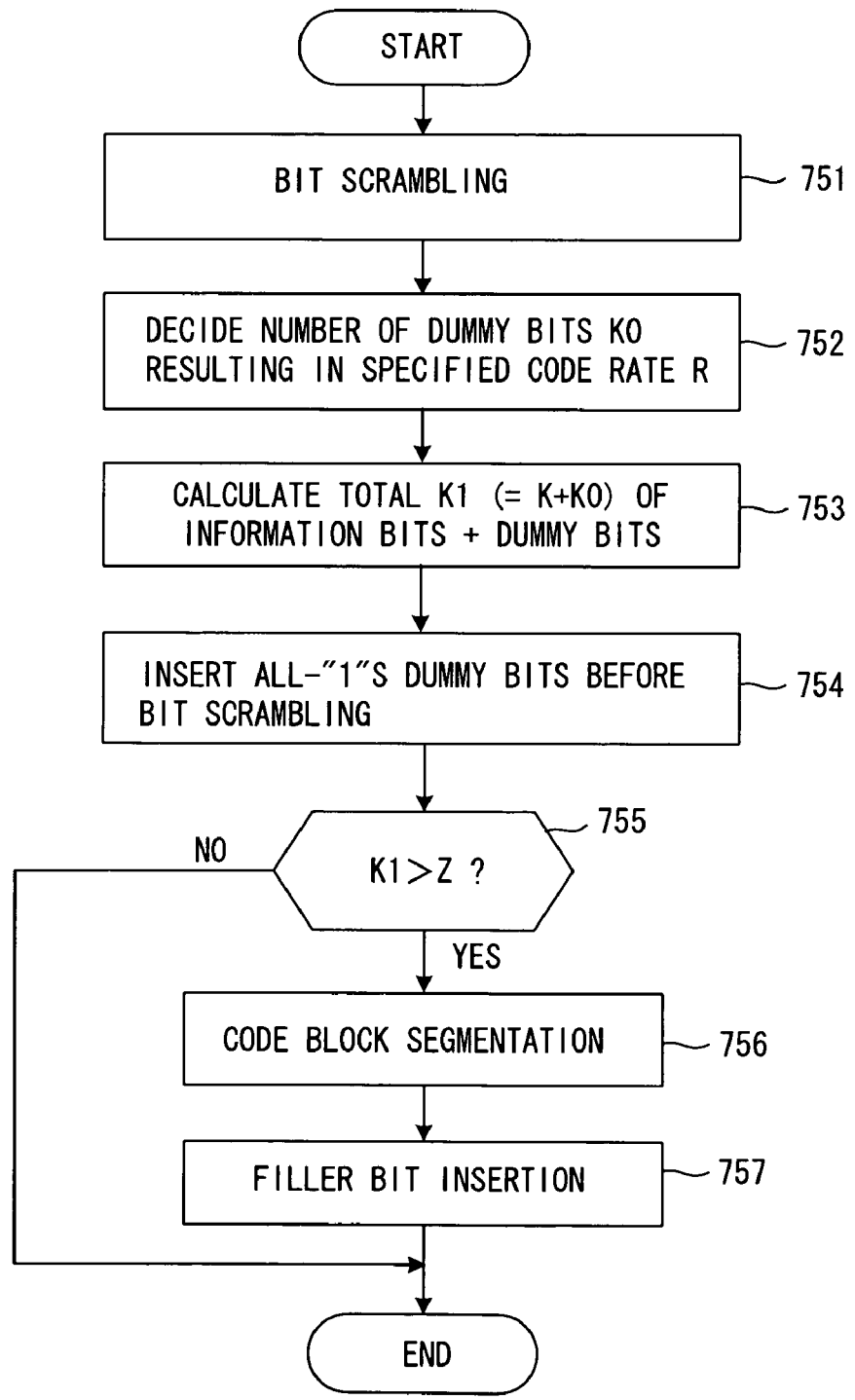
FIG. 23 shows the flow of dummy bit insertion processing in the seventh embodiment.

The seventh embodiment is an embodiment in which dummy bits are inserted after bit scrambling; FIG. 21 explains dummy bit insertion, FIG. 22 is a block diagram of principal portions of the transmission processing portion, and FIG. 23 shows the flow of dummy bit insertion processing.

The bit scrambling portion 22 performs bit scrambling ((b) in FIG. 21; step 751) of the information bits ((a) in FIG. 21) with CRC bits added by the CRC addition portion 21. Then, the dummy bit size judgment portion 31a of the dummy bit insertion portion decides the dummy bit size K0 using equation (2), such that the code rate is the stipulated code rate R (step 752), calculates the total size K1 (=K+K0) of the information bit size K and dummy bit size K0 (step 753), and the dummy bit insertion portion 31b inserts all-"1"s dummy bits of size K0 into the bit-scrambled information bits ((c) of FIG. 21; step 754). Here, all-"0"s dummy bits are inappropriate.

The code block number/code block size judgment portion 23b of the code block segmentation portion 23 compares the magnitudes of the total size K1 of information bits and dummy bits with the stipulated size Z (step 755). If K1≦Z, code block segmentation is not performed; but if K1>Z, the number of code blocks and code block size are decided, and the segmentation portion 23c performs code block segmentation (step 756). Then, filler bits are inserted (step 757).

Thereafter, similarly to the first embodiment, the encoding portion 24 performs turbo encoding of each of the code blocks with dummy bits inserted, and the physical layer HARQ function portion 25 deletes dummy bits and performs prescribed rate matching, and transmits the systematic code without dummy bits. On the receiving side, the systematic code is received, the dummy bits which had been deleted on the transmitting side are inserted into the received systematic code as maximum-likelihood values, turbo decoding is performed, and the information bits are obtained.

Figure 24:
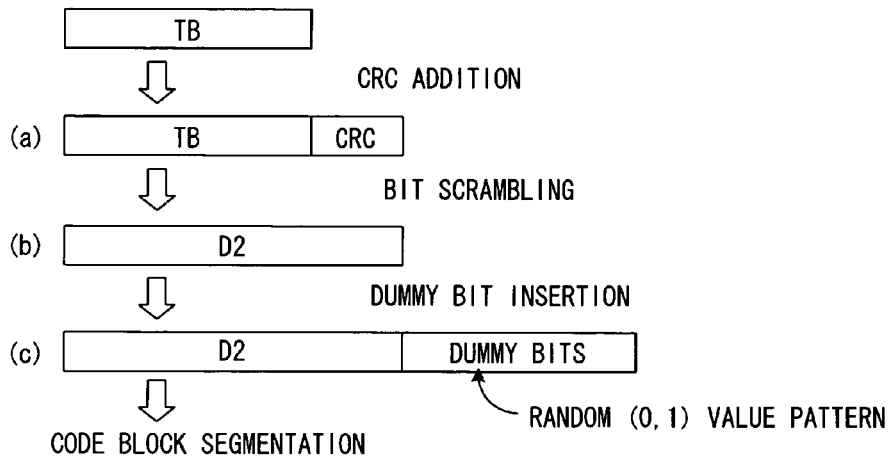
FIG. 24 is an example of a random pattern of dummy bit values in the seventh embodiment.

In the above, an example was explained in which the dummy bit insertion portion 31 inserts all-"1"s dummy bits; but as shown in (c) of FIG. 24, the dummy bit values can be made a random pattern.

By means of the seventh embodiment, dummy bits can be inserted after bit scrambling.

(H) Eighth Embodiment

Figure 25:
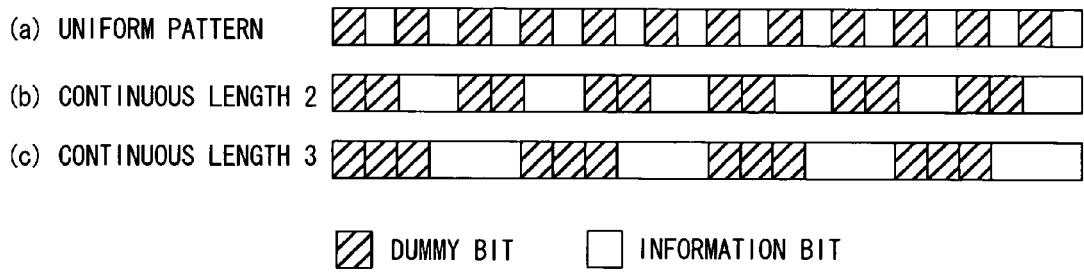
FIG. 25 is an example of a dummy bit insertion pattern in an eighth embodiment.

The eighth embodiment is an embodiment of dummy bit insertion patterns in the information bits. As an insertion pattern, a pattern in which systematic bits and dummy bits are alternated as shown in (a) of FIG. 25 can improve decoding characteristics compared with a pattern in which dummy bits are placed together before and after the information bits.

However, an alternating placement pattern is for a case in which the sizes of the systematic bits and dummy bits are the same; when the sizes are different, alternating placement is not possible. Hence dummy bits are inserted into systematic bits with dummy bits of only a specified continuous length allowed. Even when the continuous length of dummy bits is made less than or equal to a preset value, with dummy bits placed in dispersed positions, decoding characteristics (decoding error characteristics) can be improved. For example, when information bits and dummy bits are the same size, and the continuous length is 2, two information bits and two dummy bits are placed in alternation as shown in (b) in FIG. 15. When the continuous length is 3, three information bits and three dummy bits are placed in alternation as shown in (c) in FIG. 15.

Figure 26:
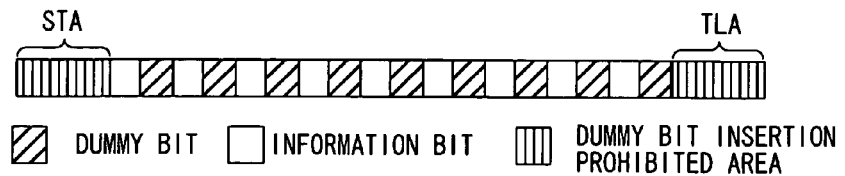
FIG. 26 explains dummy bit insertion positions.

Further, as shown in FIG. 26, a pattern is possible in which dummy bits are not inserted on the periphery STA and TLA at the beginning and at the end of the information. This is because in Viterbi decoding and MAP decoding, the reliability of code at the beginning and at the end of the information is sufficiently high. Hence as shown in FIG. 26, dummy bits are dispersed and inserted in the area excluding the periphery STA and TLA at the beginning and end of the information.

Figure 27:
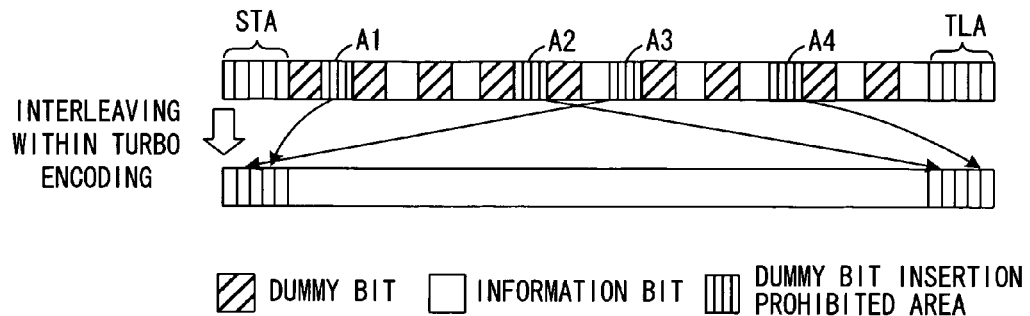
FIG. 27 explains dummy bit insertion positions taking interleaving into consideration.

Further, based on the internal interleave pattern of the turbo encoding, bit positions A1 to A4 which move to a stipulated number of positions at the beginning and end of the information by interleaving processing are specified in advance, as shown in FIG. 27. Dummy bits are likewise not inserted into these positions A1 to A4 either. The reason for this is the same as that of FIG. 26.

(I) Ninth Embodiment

Figure 28:
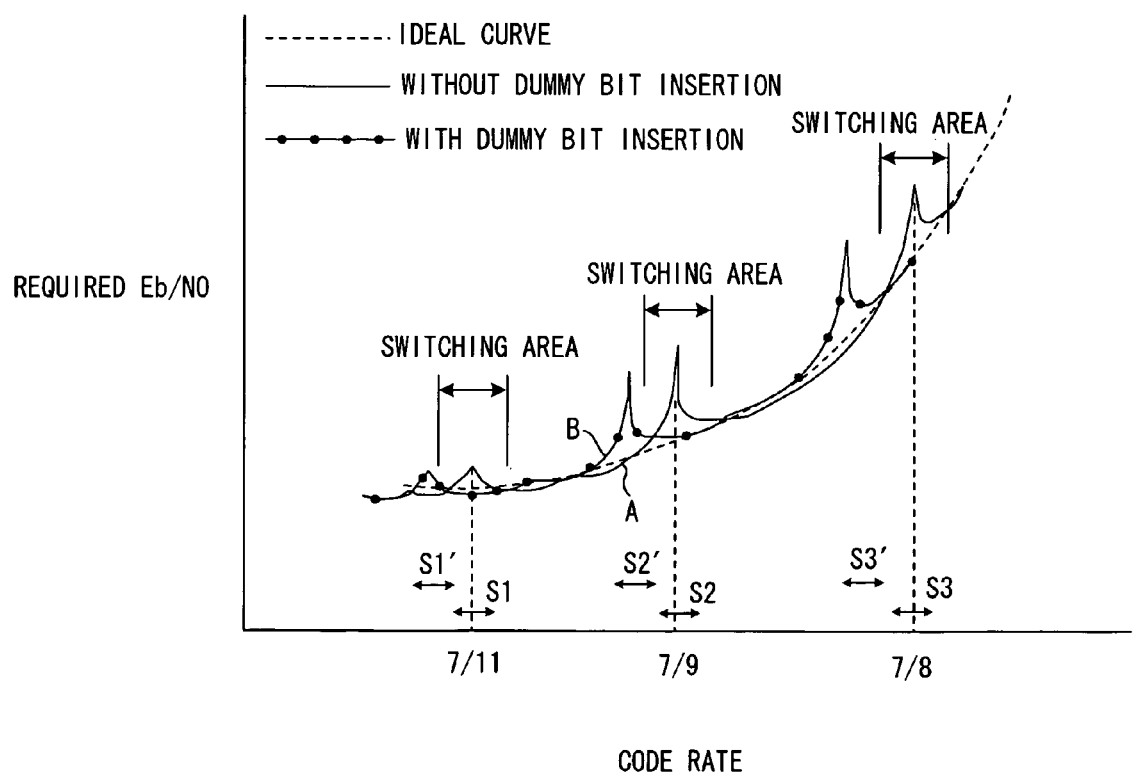
FIG. 28 shows Eb/NO characteristics (decoding characteristics) required for different code rates.

3GPP turbocodes have the characteristic when the code rate reaches a specific value due to puncturing or similar, the characteristic degradation is locally large compared with the peripheral code rates. FIG. 28 explains this characteristic degradation; A is the decoding characteristic when there is no dummy bit insertion, in which the horizontal axis is the code rate, and the vertical axis is the required Eb/No to obtain a prescribed error rate. As is clear from the decoding characteristic, when the code rate reaches a specific value (7/11, 7/9, 7/8), the required Eb/No becomes large compared with the peripheral code rate, and the characteristic is degraded. Hence in the ninth embodiment, monitoring is performed to determine whether the code rate after puncturing has reached a value close to a specific value (a value in a specific range S1, S2, S3), and if the value is in a specific range S1, S2, S3, dummy bits are inserted prior to puncturing, thereby the decoding characteristic is shifted as indicated by B, and the code rate assumes a value outside the specific ranges S1', S2', S3' determined by the decoding characteristic B is performed, to prevent characteristic degradation. The dummy bit insertion amount is determined such that the code rate exists just outside the periphery of the peak in the characteristic B after shifting.

Figure 29:
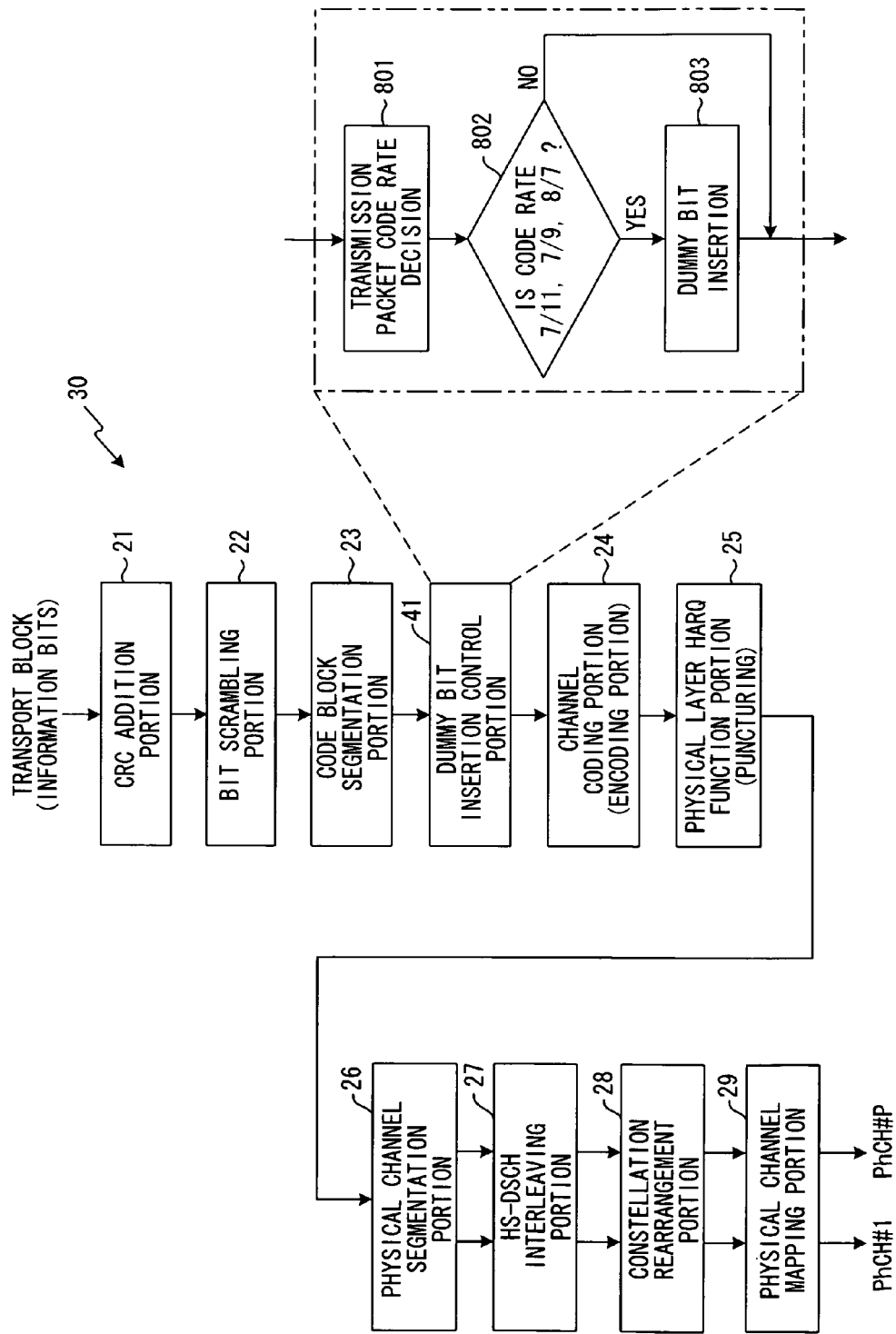
FIG. 29 shows the configuration of the transmission processing portion in the wireless base station of a ninth embodiment.

FIG. 29 shows the configuration of the transmission processing portion in the wireless base station of the ninth embodiment; the transmission processing portion 30 comprises a CRC addition portion 21, bit scrambling portion 22, code block segmentation portion 23, dummy bit insertion control portion 41, channel coding portion (encoding portion) 24, physical layer HARQ function portion 25, physical channel segmentation portion 26, HS-PDSCH interleaving portion 27, constellation rearrangement portion 28, physical channel mapping portion 29, and transmission portion (not shown).

The dummy bit insertion control portion 41 is provided between the code block segmentation portion 23 and the encoding portion 24, and executes control to determine whether, based on the code rate, dummy bits are inserted into information bits. That is, the dummy bit insertion control portion 41 calculates the code rate R taking into account puncturing in the physical layer HARQ function portion 25 (step 801). If the information bit length is K, the parity bit length for systematic code obtained by encoding of the information is M, and the number of puncturing bits is P, then the code rate R is $$R = K/(K+M-P)$$

In the case of turbo encoding, M=2K, so that R=K/(3K−P).

The dummy bit insertion control portion 41 checks whether the calculated code rate R is a value within the ranges S1, S2, S3, centered on the specific values 7/11, 7/9, 7/8 respectively and of width ±Δ (step 802). If not a value in these ranges, the dummy bit insertion control portion 41 does not insert dummy bits; but if the value is within these ranges, dummy bits are inserted into information bits such that the decoding characteristic is shifted from A to B and the code rate assumes a value outside the specific ranges S1', S2', S3' (step 803).

By means of the ninth embodiment, dummy bits are inserted such that the code rate does not assume a value in specific ranges which cause degradation of the decoding characteristic, so that degradation of the decoding characteristic can be prevented.

(J) Tenth Embodiment

When using turbocodes for encoding, if the dummy bit insertion position patterns are made as uniform as possible in both the input bits (called the "first input" and "second input" respectively) to the first element encoder and second element encoder of the turbo encoding portion, decoding characteristics can be improved.

For this reason, efforts are made to avoid positioning other dummy bits insofar as possible within several bits before and after a dummy bit insertion position. That is, when the number of information bits is K and the number of dummy bits is K0, and when K0≦K, in both the first and second inputs an ideal arrangement is used in which dummy bits are not made adjacent, and moreover the dummy bit insertion positions in both the first and second inputs are equal. Further, when K0>K, an ideal arrangement is used in which information bits are not made adjacent in both the first and second inputs, and moreover the information bit insertion positions in both the first and second inputs are equal. When K0>K and dummy bits are more numerous than information bits, in principle at least two dummy bits are adjacent. In this case, uniformity is realized by interchanging the roles of the dummy bits and the information bits.

When the ratio of K0 to K is not an integer, and when such an arrangement is not possible due to a positional relationship resulting from interleaving, interchanging of dummy bit positions and information bit positions is allowed. However, this interchanging is performed substantially equally for each of the first and second inputs.

Figure 30:
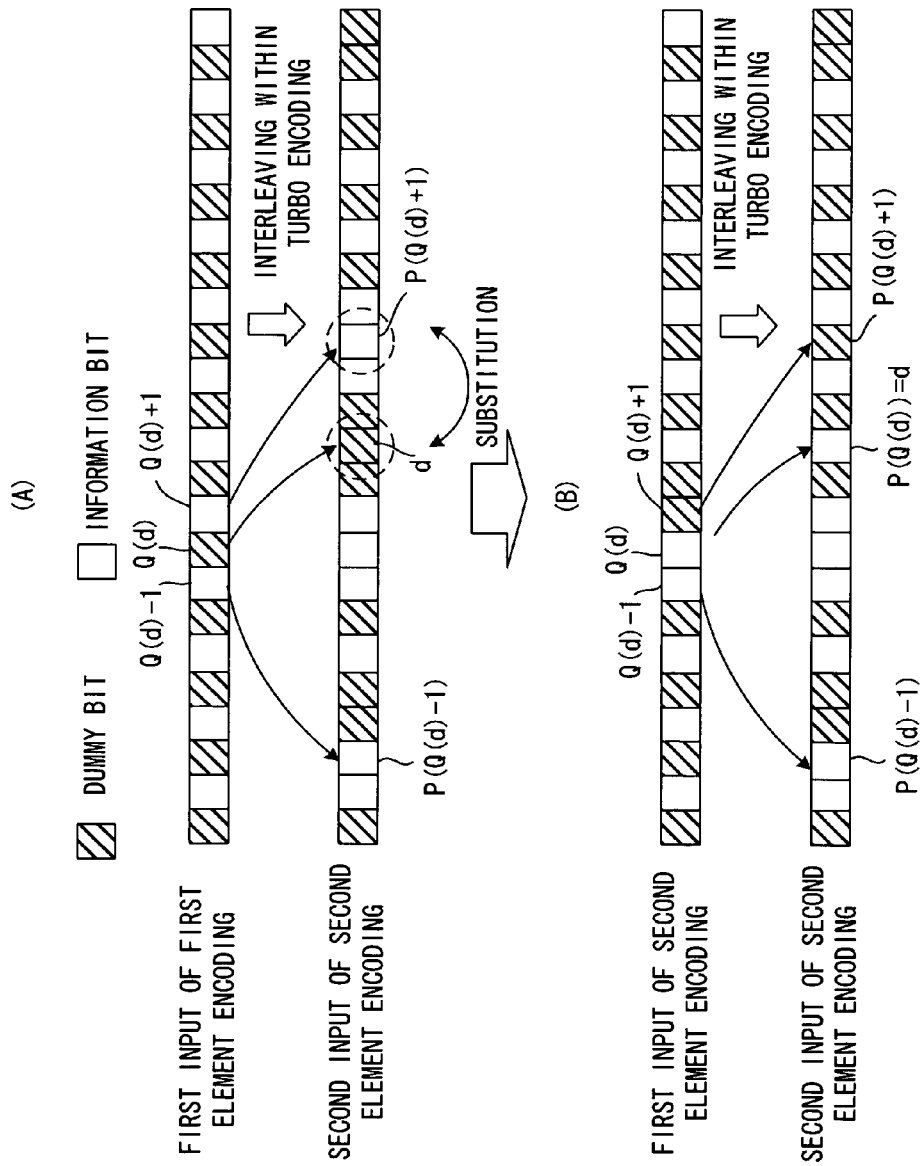
FIG. 30 explains the dummy bit insertion position pattern in a tenth embodiment.

For example, as shown in (A) in FIG. 30, when K=K0, completely uniform arrangement is performed for the first input (alternating arrangement), and the interleaving pattern P is employed to generate the second input. In the second input, a search is performed for portions in which the dummy bit burst length (continuous length) is 3 or more, and if such portions exist, a dummy bit position d is determined such that, when the dummy bit is changed to an information bit, the burst length becomes 1 or 2. Then, the position in the first input corresponding to this dummy bit position d is determined from Q(d). Here Q is the deinterleaving pattern, and P(Q(d))=d. In the first input, the positions Q(d)+1 adjacent on both sides of the position Q(d) are currently information bits; and when a dummy bit is inserted at each of bit positions (P(Q(d)+1), P(Q(d)−1) in the second input corresponding to the bit positions Q(d)±1 in the first input, the bit position (in the figure, P(Q(d)+1) is selected for which the generated dummy bit burst length is shorter. And, as shown in (B) in FIG. 30, the dummy bit at position Q(d) and the information bit at position Q(d)+1 in the first input are interchanged. That is, position Q(d) in the first input is changed from a dummy bit to an information bit, and position Q(d)+1 is changed from an information bit to a dummy bit. By this means, the continuous length of dummy bits in the second input after interleaving can be kept to 2 or less.

Figure 31:
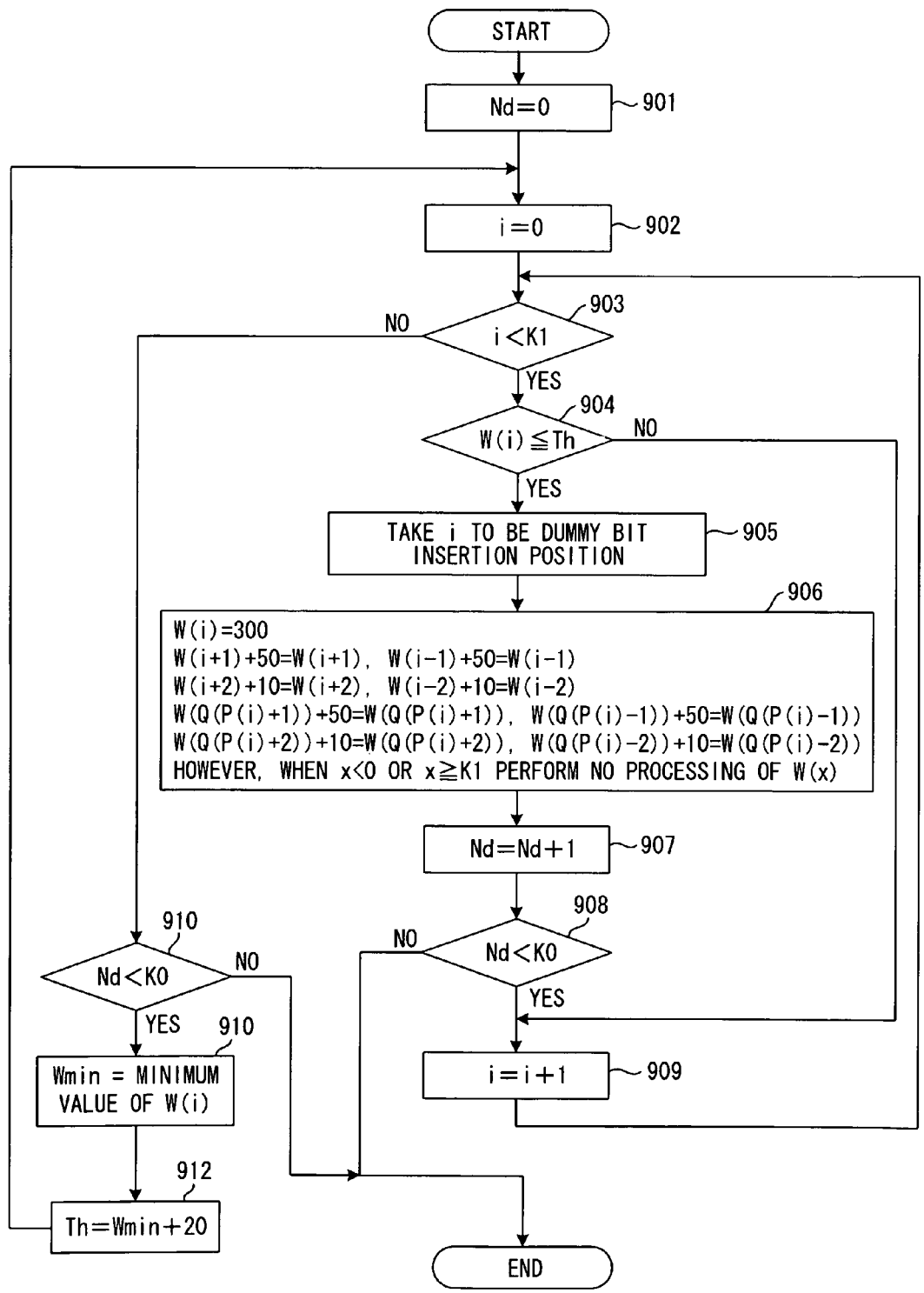
FIG. 31 shows the flow of dummy bit position modification in the tenth embodiment.
Figure 32:
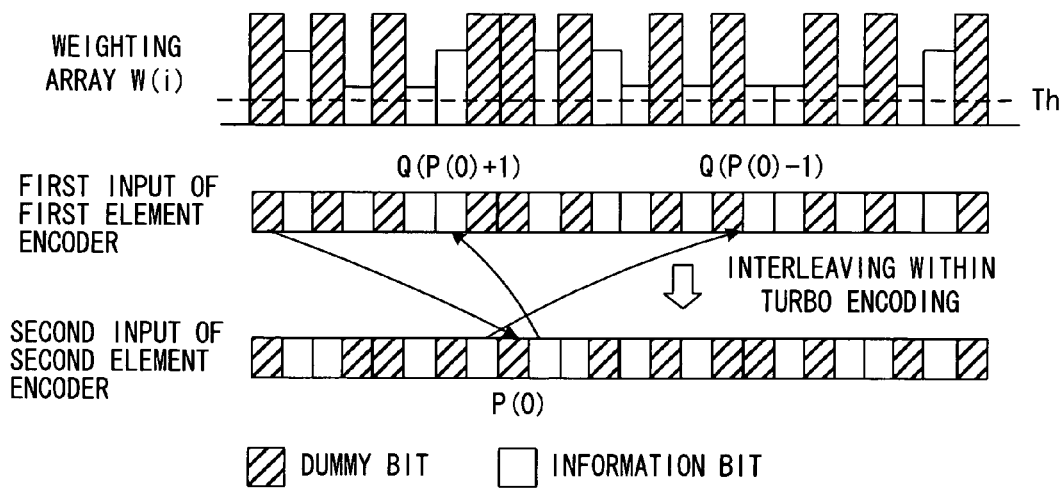
FIG. 32 explains dummy bit position modification in the tenth embodiment.

FIG. 31 shows the flow of an efficient algorithm to modify dummy bit positions so as to satisfy the condition explained in FIG. 30. Suppose that the input information bit size is K, the dummy bit size is K0, and the combined bit size is K1, so that K1=K+K0. Further, P(i), Q(i) are respectively the interleaving pattern and the inverse thereof (deinterleaving pattern). That is, Q(P(i))=i. Further, suppose that the number of dummy bits of which positions have been determined is Nd, and that the threshold for position judgment is Th=10. Moreover, weighting coefficients W(i) are associated with each bit position i as shown in FIG. 32. First, a counter is initialized to Nd=0, and all weighting coefficients W(i) are initialized to 0 (step 901). Then, the following operation is repeated iteratively for i=0 to K1−1. That is, with i=0, if i<K1 (steps 902 to 903), a check is performed as to whether W(i)≦Th (step 904). If W(i)≦Th, the position i is made a dummy bit position (step 905), and the weighting coefficient is updated as indicated below (step 906).

$$W(i) = 300$$
$$W(i+1) + 50 = W(i+1)$$
$$W(i-1) + 50 = W(i-1)$$
$$W(i+2) + 10 = W(i+2)$$

-continued $$W(i-2) + 10 = W(i-2)$$

$$W(Q(P(i)+1)) + 50 = W(Q(P(i)+1))$$

$$W(Q(P(i)-1)) + 50 = W(Q(P(i)-1))$$

$$W(Q(P(i)+2)) + 10 = W(Q(P(i)+2))$$

$$W(Q(P(i)-2)) + 10 = W(Q(P(i)-2))$$

Here, when x<0 or x≦K1 in regard to W(x), no processing is performed.

Next, the number Nd of dummy bits for which positions have been determined is incremented (Nd+1=Nd; step 907), and a check is performed as to whether Nd<K0 (step 908); if Nd≦K0, processing ends, and if Nd<K0 then i is advanced (step 909) and the processing of step 903 and beyond is continued. In step 904, if W(i)>Th, i is immediately advanced (step 909), and the processing of step 903 and beyond is continued.

On the other hand, in step 903, when i=K1 a check is performed as to whether Nd<K0 (step 910), and if Nd≧K0 processing ends, but if Nd<K0, Wmin is made the smallest value of W(i) (step 911), and then Th is set equal to Wmin+20 (step 912), and the processing of step 902 and beyond is repeated.

There are cases in which problems may arise when employing the method, which has been the basis of the embodiments thus far, of uniformly inserting dummy bits into the input information bits. For example, when turbo encoding is adopted, the input of the second element encoder of the turbo encoding portion is a pattern resulting from interleaving. For this reason, if dummy bits are simply inserted uniformly into information bits prior to interleaving, the positions of the dummy bits change due to interleaving, and so the dummy bit positions of the second input of the second element encoder are no longer uniform. As a result, an undesirable pattern (with long continuations of dummy bits) occurs in the second input, causing degradation of decoding characteristics. On the other hand, in the tenth embodiment, the above-described algorithm is used to decide dummy bit insertion positions such that dummy bit continuous lengths are not long. That is, the dummy bit insertion positions are decided one by one, and the weightings of the adjacent and next-adjacent positions of the dummy bits are increased in both the first and second inputs, so that such positions are not easily selected as dummy bit positions; by this means, dummy bit continuous lengths are kept from becoming long.

Moreover, algorithms are not limited to that described above; any algorithm which arranges dummy bit insertion position patterns as uniformly as possible in both the first and second inputs can be adopted in the tenth embodiment.

In the above, a method of deciding the dummy bit size K0 was not explained; but as explained in the second embodiment, the size of the dummy bits to be inserted into information bits is decided based on the specified code rate. Or, as explained in the third embodiment, the size of dummy bits K0 is calculated such that the code size is equal to the bit length Ndata determined by the physical channel transmission rate.

(K) Eleventh Embodiment

It is known that in many cases, arrangement of the dummy bit insertion positions at the inputs to both the first element encoder and the second element encoder of the turbo encoding portion so as to be as widely dispersed overall as possible is effective for improving characteristics. The method of the tenth embodiment to realize such an arrangement has the problem of employing a position generation algorithm which is complex and requires large amounts of processing and long processing time. In the eleventh embodiment, the dummy bit insertion positions in both the first and second inputs of the first and second element encoders are simply made as widely dispersed overall as possible.

Figure 33:
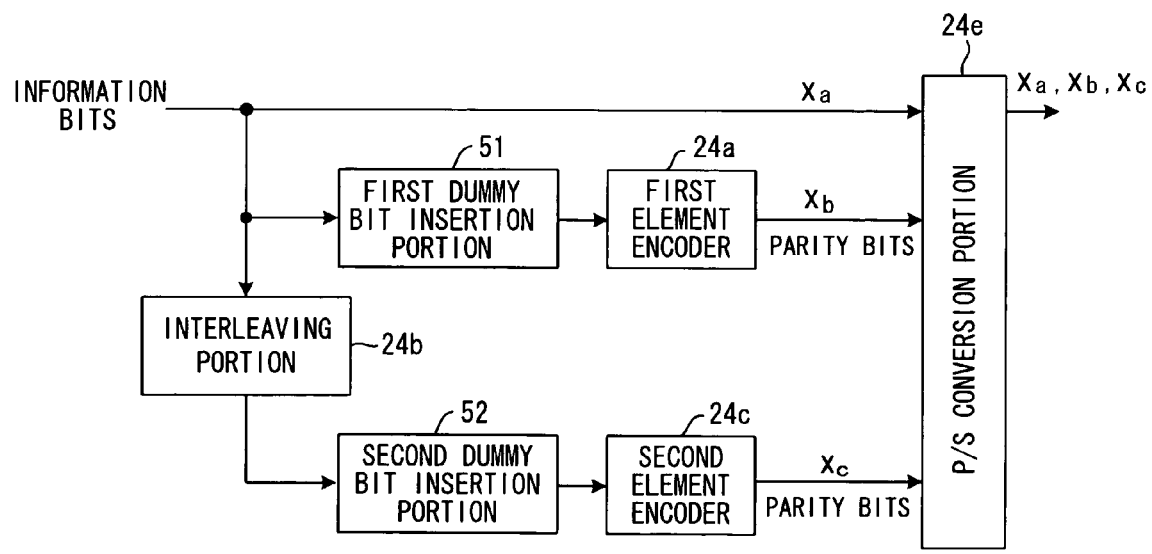
FIG. 33 shows the configuration of the turbo encoder of an eleventh embodiment.

FIG. 33 shows the configuration of the turbo encoder of the eleventh embodiment; the first element encoder 24a encodes information bits with dummy bits inserted, the interleaving portion 24b interleaves the information bits with dummy bits inserted, the second element encoder 24c encodes the result of interleaving, and the P/S conversion portion 24e converts the outputs xb, xc of the element encoders 24a, 24b and the information bits xa into series data. The first and second dummy bit insertion portions 51, 52 insert dummy bits into the first and second inputs, which are the inputs of the first and second element encoders 24a, 24b. It is preferable that the dummy bits be inserted into both the first and the second inputs so as to be widely dispersed overall, and so as to be as uniform as possible.

The size of dummy bits for insertion K0 is, as explained in the second embodiment, based on a specified code rate and calculated using equation (2), or is, as explained in the third embodiment, calculated using equation (4) such that the code length is equal to the bit length Ndata determined by the physical channel transmission rate.

In the configuration of FIG. 33, two element encoders are provided; however, a single element encoder can perform the first and second element encoding processing.

Figure 34:
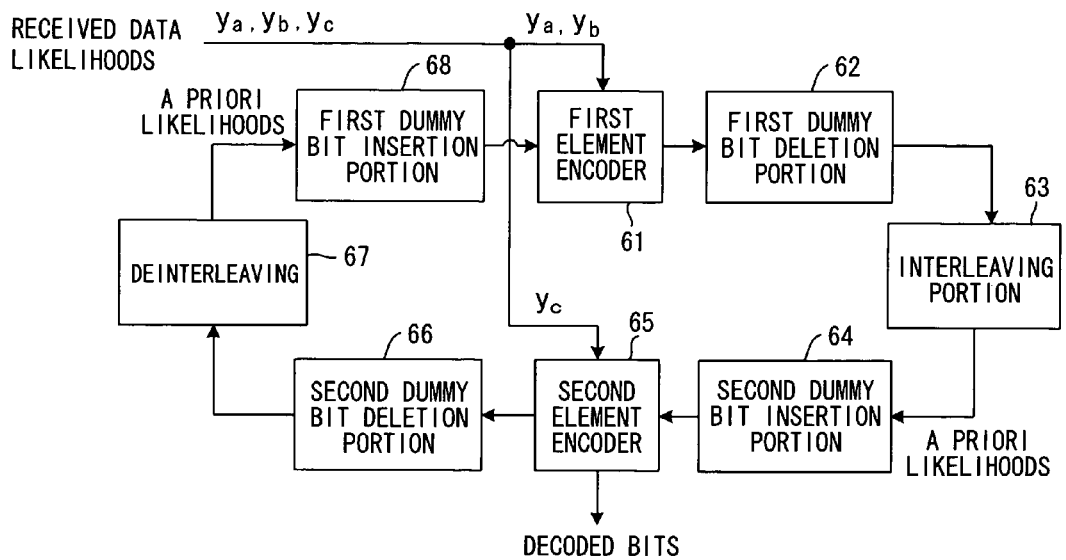
FIG. 34 shows the configuration of the turbo decoding portion of the eleventh embodiment.
Figure 35:
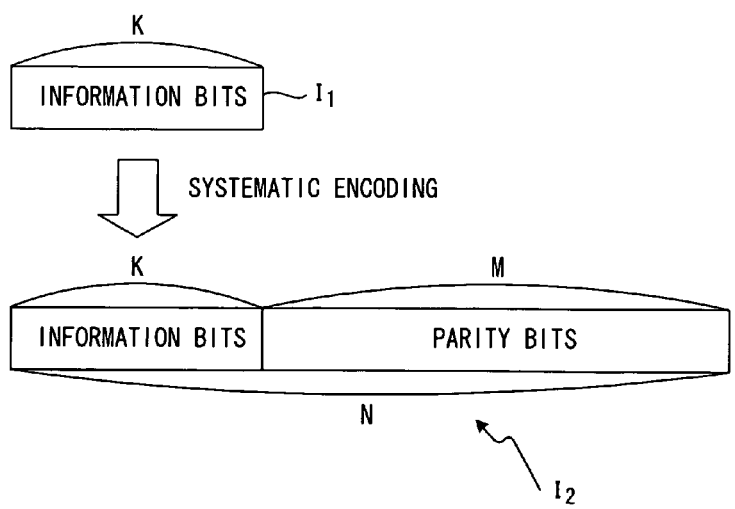
FIG. 35 explains systematic codes.
Figure 36:
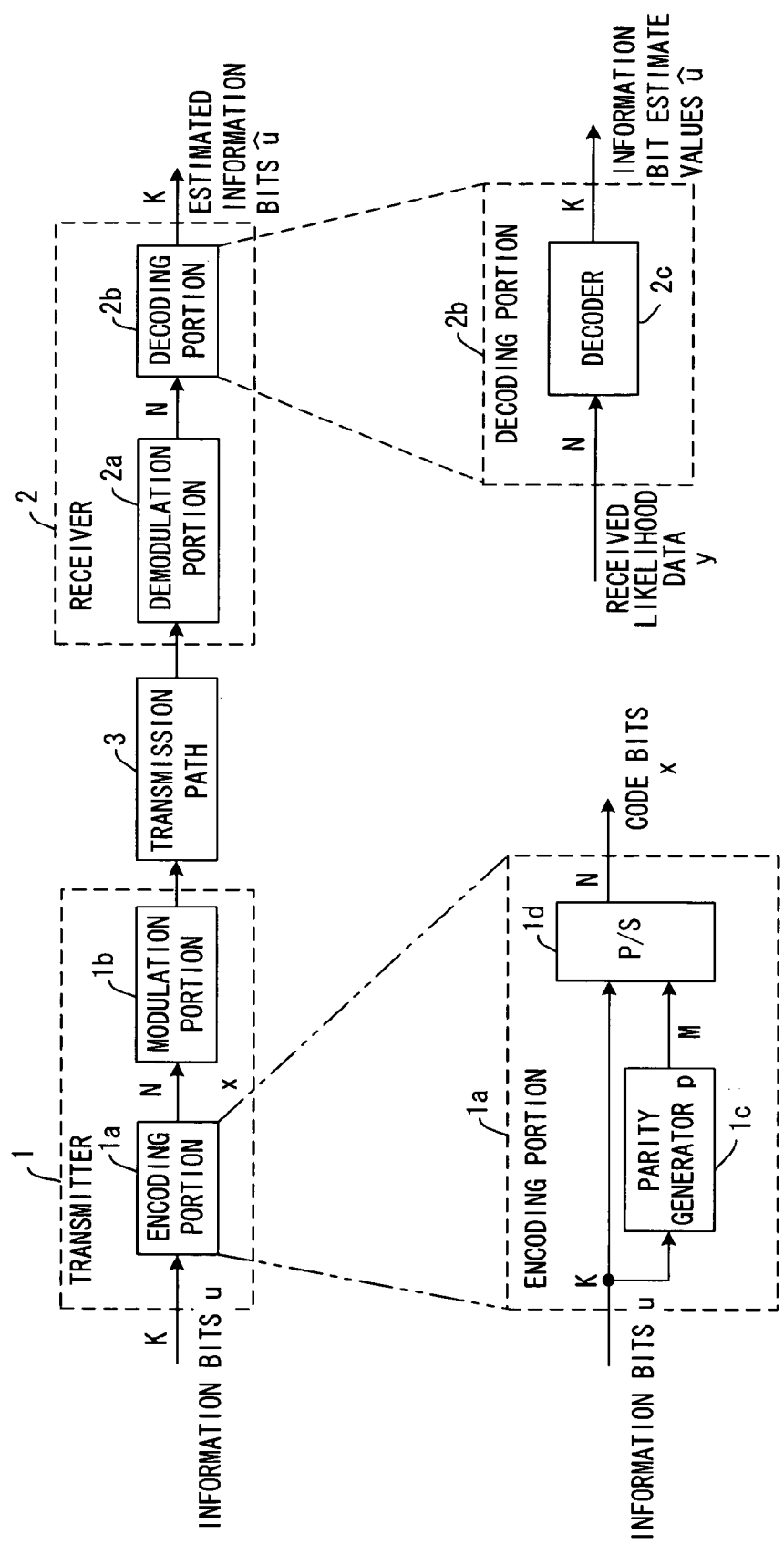
FIG. 36 shows the configuration of a communication system of the prior art, in which block encoding is performed in the transmitter and decoding is performed in the receiver.
Figure 37:
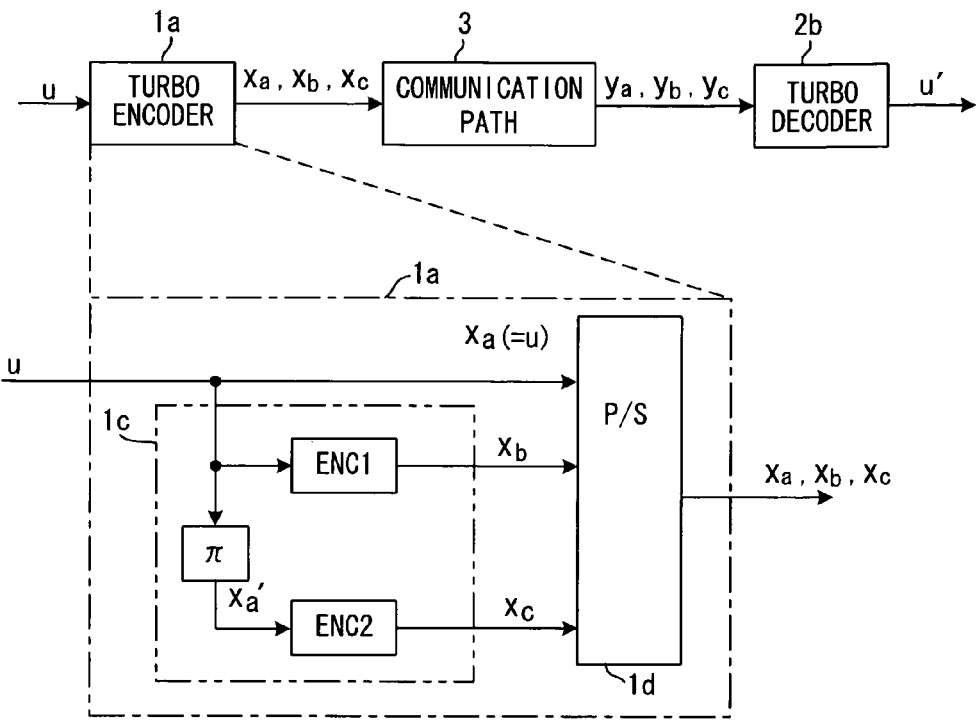
FIG. 37 shows the configuration of a turbo encoder portion.
Figure 38:
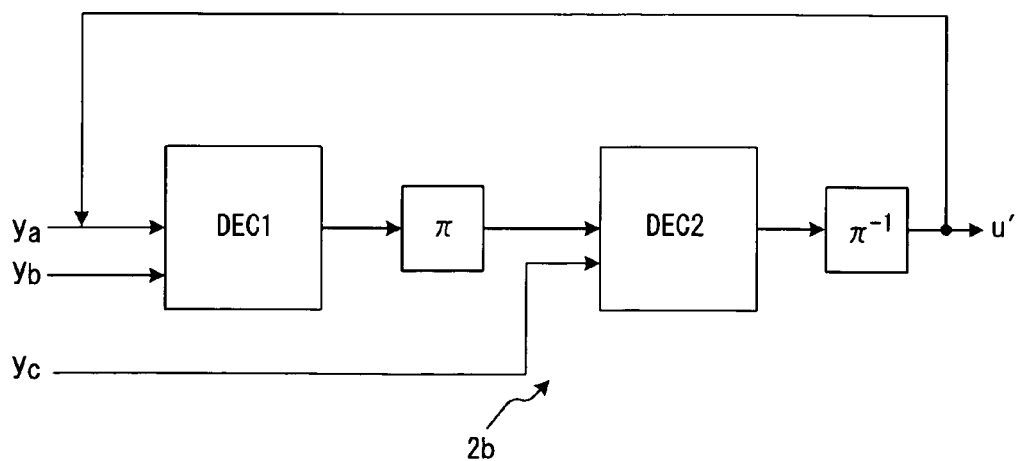
FIG. 38 shows the configuration of a turbo decoder portion.
Figure 39:
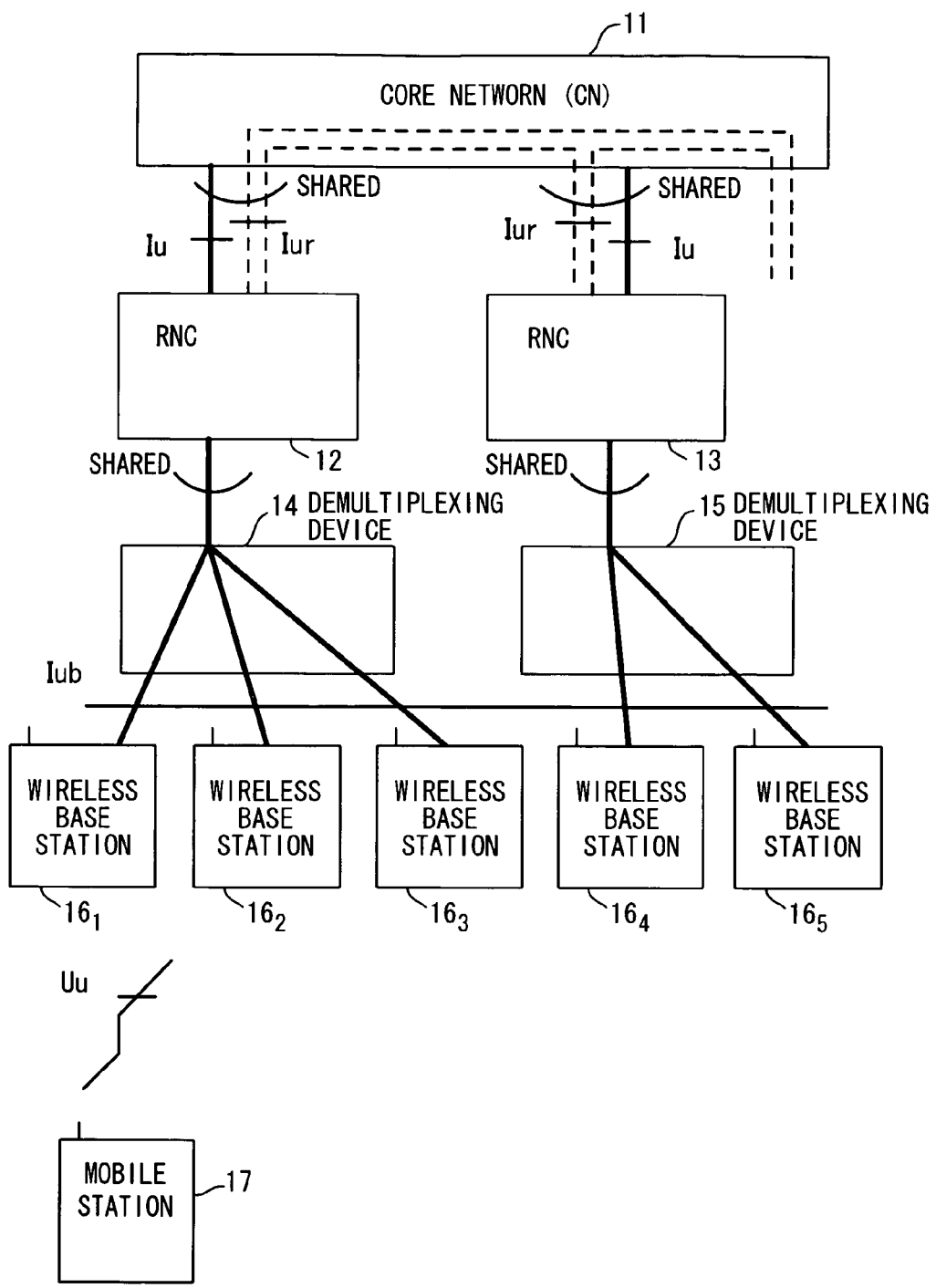
FIG. 39 shows the configuration of a 3GPP W-CDMA mobile communication system.
Figure 40:
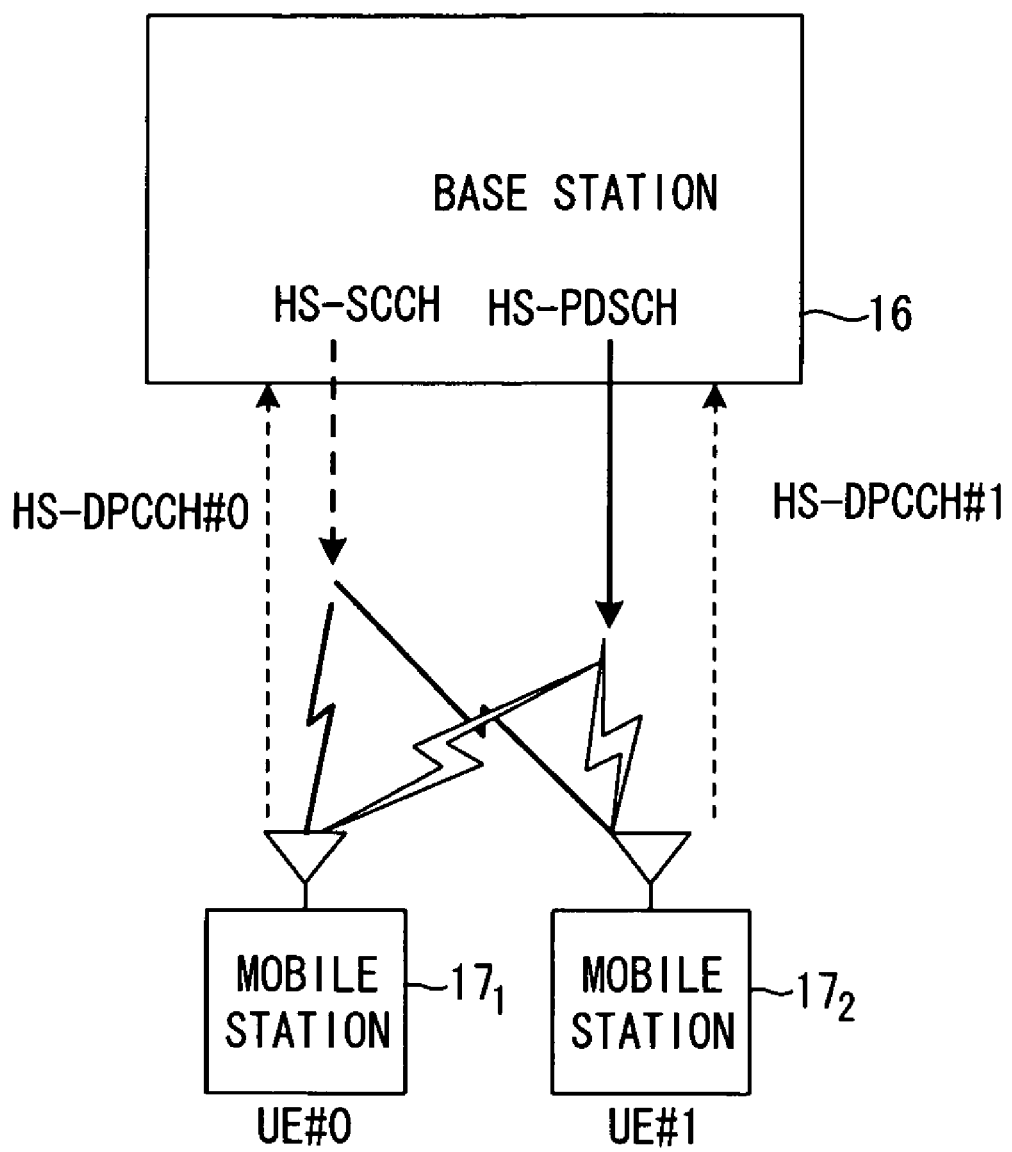
FIG. 40 explains shared channels in HSDPA.

FIG. 34 shows the configuration of the turbo decoder portion on the receiving side which decodes the turbocode encoded by the encoder of FIG. 33, wherein first and second dummy bits are same as the first and second dummy bits in the encoder.

The first element decoder 61 uses ya and yb among the received signals ya, yb, yc to perform decoding. The first element decoder 61 is a soft-decision output element decoder, which outputs decoding result likelihoods. The first dummy bit deletion portion 62 deletes the first dummy bits from the decoding result of the first element decoder 61, the interleaving portion 63 interleaves the decoding result with dummy bits deleted, and the second dummy bit insertion portion 64 inserts second dummy bits into the interleaved decoding results as maximum-likelihood values.

The second element decoder 65 performs decoding using the received signal yc and the decoding result of the first element decoder 61, which has been subjected to interleaving and second dummy bit insertion processing. The second element encoder 65 is also a soft-decision output element decoder, which outputs decoding result likelihoods. The second dummy bit deletion portion 66 deletes the second dummy bits from the decoding output of the second element decoder 65, the deinterleaving portion 67 deinterleaves the decoding result with the dummy bits deleted, and the first dummy bit insert portion 68 inserts the first dummy bits as maximum-likelihood values into the deinterleaved decoding results, and inputs the results to the first element decoder 61. In place of the received signal ya, the first element decoder 61 uses the output signal of the first dummy bit insertion portion 68 to repeat the above MAP decoding processing. By repeating the above decoding operation a prescribed number of times, the decoding result error rate can be reduced. MAP element decoders are used as the first and second element decoders in this turbo element decoder.

The above processing to delete and add maximum-likelihood reliabilities for dummy bit data is performed in order that a trellis path limited by the dummy bit values is selected; in place of this insertion and deletion, the trellis path can also be selected directly.

In the configuration of FIG. 34, two element decoders are provided; but a single element decoder can perform the first and second element decoding. Similarly, a single dummy bit deletion portion and a single dummy bit insertion portion can be made to perform the first and second dummy bit deletion processing and the first and second dummy bit insertion processing.

By means of the eleventh embodiment, insertion positions can be made mutually independent in both the inputs to the first element encoder 24a and to the second element encoder 24c; in particular, patterns which are uniform overall can be selected for both. Moreover, a dummy bit deletion portion becomes unnecessary.

(L) Advantageous Results of the Invention

As explained above, according to this invention, dummy bits are inserted into information bits, then the information bits into which the dummy bit inserted are subjected to turbo encoding, and the systematic code obtained by deleting the dummy bits from the turbocode is transmitted; on the receiving side, the systematic code is received, the dummy bits which had been deleted on the transmitting side are inserted into the received systematic code as maximum-likelihood values, and turbo decoding is performed, and by this means decoding errors can be reduced.

Further, according to this invention, by providing a dummy bit deletion portion in the physical layer HARQ function portion or in the encoding portion, the dummy bits can easily be deleted from systematic bits. Further, according to this invention, processing to delete dummy bits from systematic bits can be performed simultaneously with puncturing processing of parity bits of the systematic code. Consequently, dummy bit deletion can be performed so as not to affect the total transmission processing time.

According to this invention, the size of dummy bits is decided so as to obtain a required code rate, and moreover rate matching can be performed and data is transmitted such that Ndata is the value given by H-ARQ transmission parameters. Further, by uniformly inserting dummy bits, decoding characteristics can be improved.

According to this invention, dummy bits can be inserted and data is transmitted with the code rate R made variable, and such that the code length is equal to Ndata.

According to this invention, even when code block segmentation is not performed, the maximum number of dummy bits can be inserted, and the code length can be made equal to Ndata to transmit the data. As a result, even when code block segmentation is not performed, the effect of dummy bit insertion can be improved.

According to this invention, dummy bits can be inserted, encoding performed, the dummy bits deleted from the results of the encoding, and the data is transmitted such that, in each code block, the total size of the dummy bits and information bits is equal to a stipulated size Z; hence the size of the inserted dummy bits can be made large, so that the effect of dummy bit insertion can be improved.

According to this invention, dummy bit insertion can be performed either before bit scrambling or after bit scrambling.

According to this invention, dummy bits are dispersed and inserted into information bits with dummy bit continuous lengths equal to or less than a set value, so that decoding characteristics can be improved. Further, dummy bits are dispersed and inserted into information bits excluding the peripheral portions at the beginning and end of the information bits, so that decoding characteristics can be improved. Further, when a code is adopted which requires interleave processing, dummy bits are dispersed and inserted at the bit positions which do not move to the beginning and end of information by interleaving, so that decoding characteristics can be improved.

According to this invention, dummy bits are inserted such that the code rate does not assume a specific value which causes degradation of the decoding characteristic, so that degradation of the decoding characteristics can be prevented.

According to this invention, when turbo encoding is adopted, the patterns of dummy bit insertion positions are made as uniform as possible in both the first and the second inputs, which are the inputs to the first element encoder and to the second element encoder, so that decoding characteristics can be improved.

According to this invention, when turbo encoding is adopted, dummy bit insertion positions can be determined without mutual dependence of the first and second inputs of the first element encoder and second element encoder, so that dummy bit insertion position patterns can easily be made uniform in the first and second outputs, and decoding characteristics can be improved.

And, according to this invention, within the turbo encoder dummy bits are inserted and parity bits generated, and moreover turbocode can be output without inserting dummy bits into systematic bits, so that a dummy bit deletion portion to delete dummy bits from systematic bits can be made unnecessary.

What is claimed is:

1. A transmission device, in a system which transmits and receives a systematic code obtained by adding parity bits to information bits, comprising:
   a code rate monitoring portion, which monitors whether the code rate of the systematic code for transmission is a value within a specific range determined by decoding characteristic in a case where dummy bits are not inserted;
   a dummy bit insertion portion, which, when the code rate is a value within the specific range, inserts dummy bits into information bits and shifts the decoding characteristic, so that the code rate is a value outside a specific range determined by the decoding characteristic after shifting;
   a systematic code generation portion, which performs systematic encoding of information bits into which the dummy bits are inserted, and also deletes the dummy bits from the results of the systematic encoding to generate a systematic code; and
   a rate matching portion, which performs rate matching processing such that the size of the systematic code from which the dummy bits are deleted is equal to a size determined by the transmission rate of a physical channel.

2. The transmission device according to claim 1, wherein the said specified range is a prescribed range on both sides of the code rate value resulting in a peak at which the decoding characteristic is worsened.

3. A transmission device in a communication system in which information bits into which dummy bits are inserted are subjected to systematically encoding, the dummy bits are deleted from the results of the encoding to obtain a systematic code which is transmitted, and on the receiving side the dummy bits deleted on the transmitting side are inserted into the received systematic code and decoding is performed, the transmission device comprising:

a dummy bit insertion portion, which inserts dummy bits into information bits;

a systematic code generation portion, which performs turbo encoding of the information bits into which the dummy bits are inserted, and also deletes the dummy bits from the results of the turbo encoding to generate a systematic code; and a transmission portion, which transmits the systematic code, wherein the dummy bit insertion portion inserts the dummy bits into the information bits such that, in the information bits both before and after interleaving in the turbo encoding processing, the dummy bit insertion position patterns are substantially uniform.

4. The transmission device according to claim 3, comprising a dummy bit size decision portion, which, based on a specified code rate or based on the physical channel transmission rate, decides the size of the dummy bits to be inserted into the information bits, wherein the dummy bit insertion portion inserts the dummy bits of the size into the information bits.

5. A transmission device in a communication system in which systematic code obtained by inserting parity bits into information bits is transmitted and, on the receiving side, the systematic code is decoded, the transmission device comprising:

a dummy bit size decision portion, which decides the size of the dummy bits to be inserted into the information bits in encoding processing;

a turbo encoding portion, which generates parity bits using the information bits into which the dummy bits are inserted, and moreover adds the parity bits to the information bits into which dummy bits are not inserted to generate a systematic code and outputs the systematic code; and a transmission portion, which transmits the systematic code, wherein the turbo encoding portion comprises:

a dummy bit insertion portion, which inserts first dummy bits of a prescribed size into the information bits, and inserts second dummy bits of a prescribed size into the information bits resulting from interleaving;

an element encoding portion, which performs first and second element encoding of the information bits into which the first and second dummy bits are inserted, and generates first and second parity bits; and, a combination portion, which takes the information bits, into which the dummy bits are not inserted, to be systematic bits, and combines the systematic bits with the first and second parity bits and outputs the result as the systematic code.

6. The transmission device according to claim 5, wherein the dummy bit insertion portion inserts the dummy bits into the information bits such that, in the information bits both before and after interleaving, the dummy bit insertion position pattern is substantially uniform.

7. An encoding device in a communication system in which a systematic code obtained by inserting parity bits into information bits is transmitted and, on the receiving side, the systematic code is decoded, comprising:

a dummy bit insertion portion, which inserts first dummy bits of a prescribed size into the information bits, and which moreover inserts second dummy bits of a prescribed size into the information bits after interleaving;

an element encoding portion, which performs first and second element encoding of the information bits into which the first and second dummy bits are respectively inserted, and generates first and second parity bits; and, a combination portion, which takes as systematic bits the information bits into which the dummy bits are not inserted, and combines the systematic bits with the first and second parity bits and outputs the result as a systematic code.

8. The encoding device according to claim 7, wherein the dummy bit insertion portion inserts dummy bits into the information bits such that, in the information bits both before and after interleaving, the dummy bit insertion position pattern is substantially uniform.

9. A decoding device in a communication system in which systematic code obtained by adding parity bits to information bits is transmitted and, on the receiving side, a systematic code is decoded, wherein in a case where first dummy bits of a prescribed size are inserted into the information bits, and moreover second dummy bits of a prescribed size are inserted into the information bits after interleaving, first and second element encoding of the information bits, into which the first and second dummy bits respectively are inserted, are performed to generate first and second parity bits, and taking the information bits into which the dummy bits not inserted as the systematic bits, the systematic bits are combined with the first and second parity bits to generate a systematic code and the systematic code is transmitted, the decoding device comprising:

an element decoding portion, which performs first and second element decoding corresponding to the first and second element encoding;

a dummy bit data deletion portion, which deletes the first and second dummy bits from the first and second element decoding results respectively;

an interleaving portion, which performs interleaving of the first decoding result obtained by deleting the first dummy bits from the first element the encoding results;

a deinterleaving portion, which performs deinterleaving of the second decoding result obtained by deleting the second dummy bits from the second element decoding results; and a dummy bit insertion portion, which inserts the first and second dummy bits, as maximum-likelihood values, into the first and second decoding results to which interleaving and deinterleaving are subjected, and inputs the results to the element decoding portion.

* * * * *